(12) United States Patent
Yang et al.

(10) Patent No.: US 11,532,731 B2
(45) Date of Patent: Dec. 20, 2022

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Wei-Siang Yang, Changhua County (TW); Ming-Hua Yu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 80 days.

(21) Appl. No.: 17/167,731

(22) Filed: Feb. 4, 2021

(65) Prior Publication Data

US 2021/0376129 A1 Dec. 2, 2021

Related U.S. Application Data

(60) Provisional application No. 63/031,095, filed on May 28, 2020.

(51) Int. Cl.
*H01L 29/66* (2006.01)
*H01L 27/092* (2006.01)
*H01L 21/8234* (2006.01)
*H01L 29/78* (2006.01)

(52) U.S. Cl.
CPC .......... *H01L 29/66795* (2013.01); *H01L 21/823418* (2013.01); *H01L 21/823431* (2013.01); *H01L 27/0924* (2013.01); *H01L 29/7851* (2013.01)

(58) Field of Classification Search
CPC ....... H01L 29/66795; H01L 21/823418; H01L 21/823431; H01L 27/0924; H01L 29/7851; H01L 29/0847; H01L 29/161; H01L 29/165; H01L 29/66545; H01L 29/7848

See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |

(Continued)

FOREIGN PATENT DOCUMENTS

| | | |
|---|---|---|
| KR | 20150089597 A | 8/2015 |
| KR | 20160011742 A | 2/2016 |

*Primary Examiner* — Karen Kusumakar
*Assistant Examiner* — Adam S Bowen
(74) *Attorney, Agent, or Firm* — Slater Matsil, LLP

(57) ABSTRACT

Semiconductor devices and methods of forming semiconductor devices are described herein. A method includes forming a first fin and a second fin in a substrate. A low concentration source/drain region is epitaxially grown over the first fin and over the second fin. The material of the low concentration region has less than 50% by volume of germanium. A high concentration contact landing region is formed over the low concentration regions. The material of the high concentration contact landing region has at least 50% by volume germanium. The high concentration contact landing region has a thickness of at least 1 nm over a top surface of the low concentration source/drain region.

20 Claims, 27 Drawing Sheets

(56) References Cited

U.S. PATENT DOCUMENTS

| | | | |
|---|---|---|---|
| 9,608,116 B2 | 3/2017 | Ching et al. | |
| 9,812,363 B1 | 11/2017 | Liao et al. | |
| 9,859,380 B2 | 1/2018 | Lee et al. | |
| 2015/0214051 A1 | 7/2015 | Kim et al. | |
| 2016/0027918 A1* | 1/2016 | Kim | H01L 29/7848 |
| | | | 257/401 |
| 2018/0337098 A1* | 11/2018 | Ando | H01L 21/823821 |
| 2019/0097006 A1* | 3/2019 | Li | H01L 29/16 |
| 2020/0044025 A1 | 2/2020 | Liu et al. | |
| 2020/0083358 A1 | 3/2020 | Xu | |

* cited by examiner

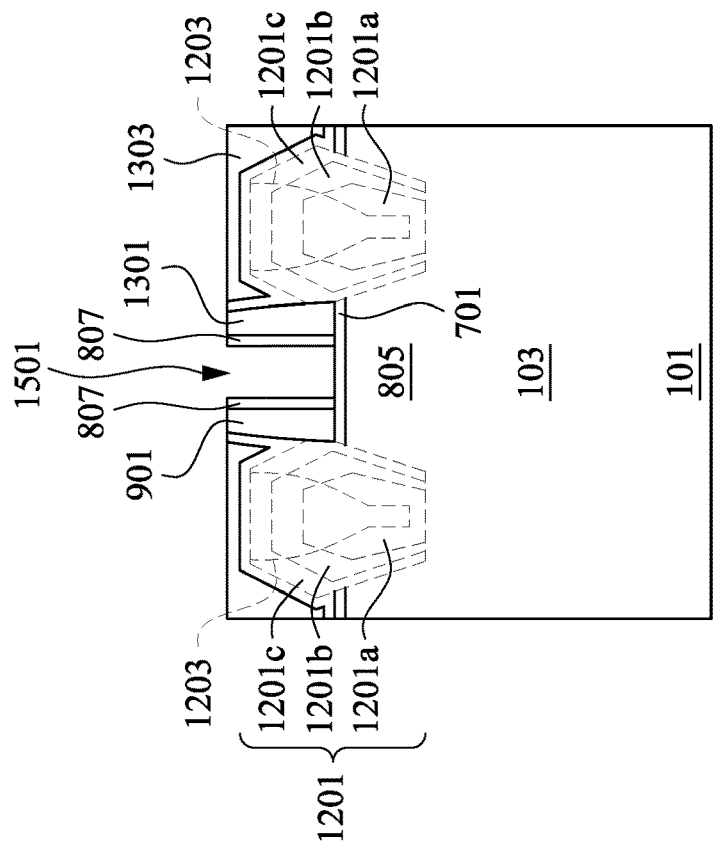
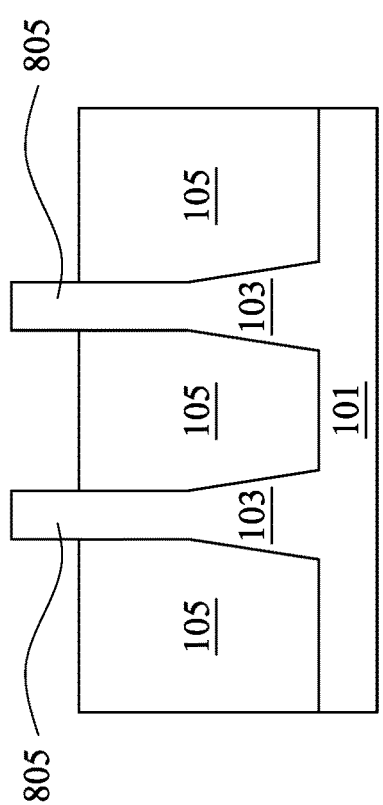
Figure 15B
Figure 15A

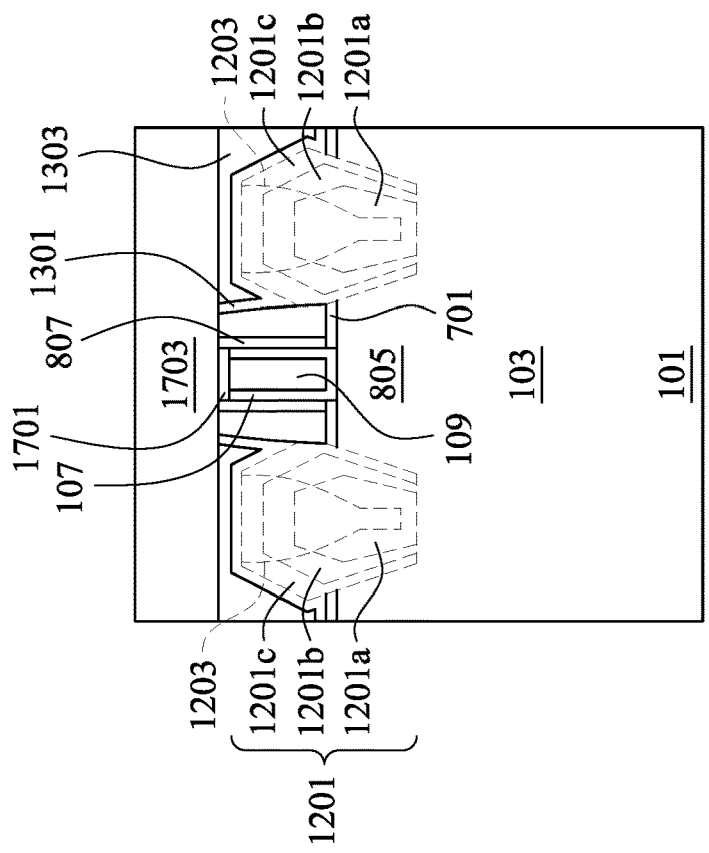
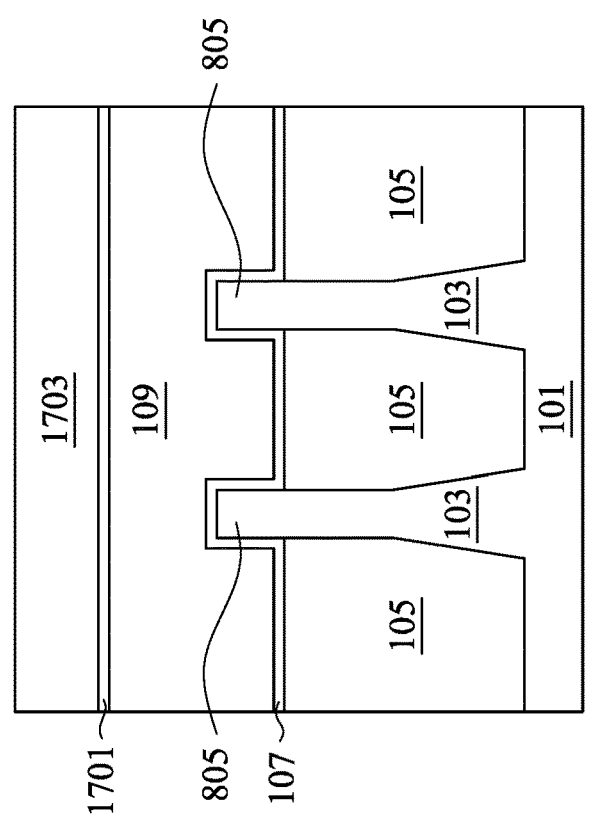
Figure 17B
Figure 17A

SEMICONDUCTOR DEVICES AND METHODS OF MANUFACTURE

PRIORITY CLAIM AND CROSS-REFERENCE

This application claims the benefit of U.S. Provisional Application No. 63/031,095, filed on May 28, 2020, and entitled: "P-SD High Ge % Volume Enlargement for Device Boosting," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A, 13B, 14A, 14B, 15A, 15B, 16A, 16B, 16C, 17A, 17B, 18A and 18B are cross-sectional views of still further intermediate stages in the manufacturing of FinFETs, in accordance with some embodiments.

DETAILED DESCRIPTION

Figure 1:
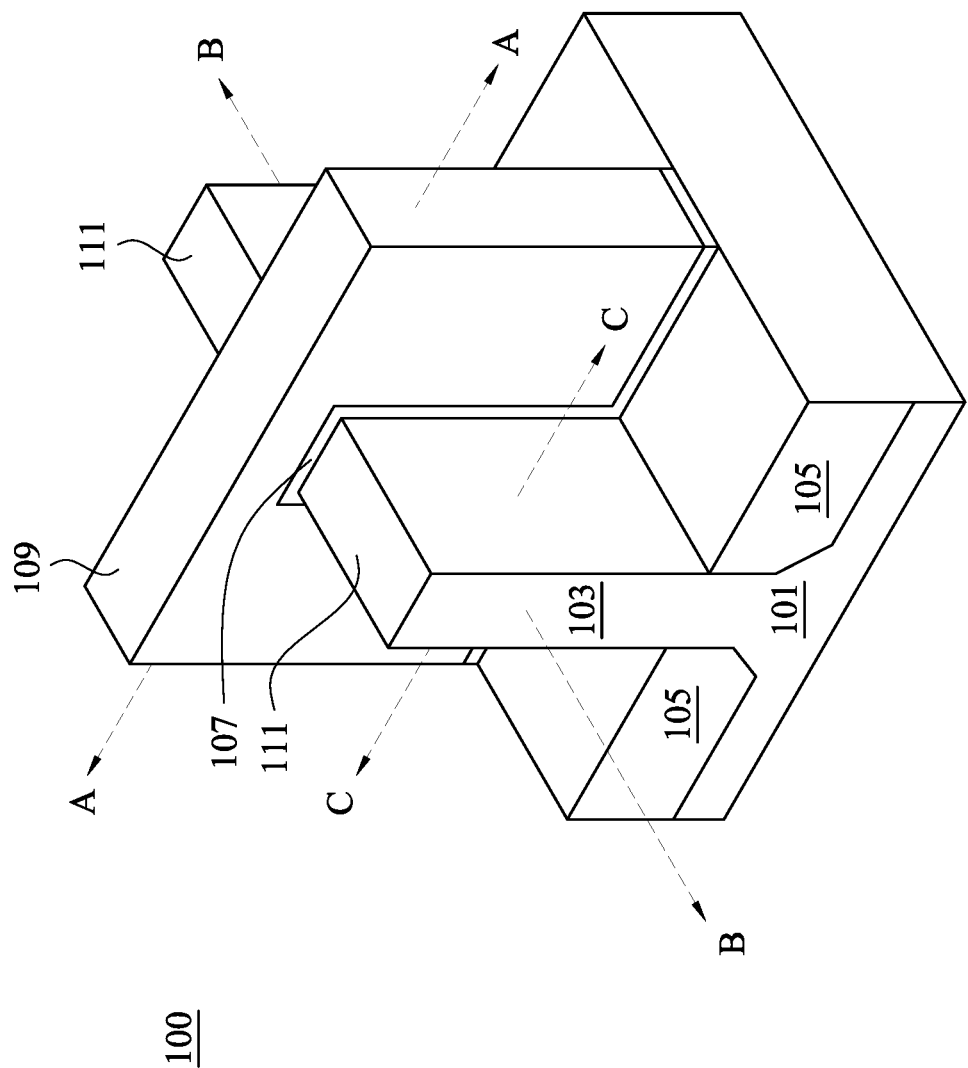
FIG. 1 illustrates a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a first FinFET 100 in a three-dimensional view, in accordance with some embodiments. The first FinFET 100 comprises a fin 103 on a substrate 101 (e.g., a semiconductor substrate). Shallow Trench Isolation (STI) regions 105 are disposed in the substrate 101, and the fin 103 protrudes above and from between neighboring STI regions 105. Although the STI regions 105 are described/illustrated as being separate from the substrate 101, as used herein the term "substrate" may be used to refer to just the semiconductor substrate or a semiconductor substrate inclusive of isolation regions. Additionally, although the fin 103 is illustrated as a single, continuous material as the substrate 101, the fin 103 and/or the substrate 101 may comprise a single material or a plurality of materials. In this context, the fin 103 refers to the portion extending between the neighboring STI regions 105.

A gate dielectric layer 107 is along sidewalls and over a top surface of the fin 103, and a gate electrode 109 is over the gate dielectric layer 107. Source/drain regions 111 are disposed in opposite sides of the fin 103 with respect to the gate dielectric layer 107 and gate electrode 109. FIG. 1 further illustrates reference cross-sections that are used in later figures. Cross-section A-A is along a longitudinal axis of the gate electrode 109 and in a direction, for example, perpendicular to the direction of current flow between the source/drain regions 111 of the first FinFET 100. Cross-section B-B is perpendicular to cross-section A-A and is along a longitudinal axis of the fin 103 and in a direction of, for example, a current flow between the source/drain regions 111 of the first FinFET 100. Cross-section C-C is parallel to cross-section A-A and extends through a source/drain region of the first FinFET 100. Subsequent figures refer to these reference cross-sections for clarity.

Additionally, while some embodiments discussed herein are discussed in the context of FinFETs formed using a gate-last process, this is intended to merely be illustrative and is not intended to be limiting. For example, in other embodiments, a gate-first process may be used. Also, some embodiments contemplate aspects used in planar devices, such as planar FETs, nanostructure (e.g., nanosheet, nanowire, gate-all-around, or the like) field effect transistors (NS-FETs), or the like.

FIGS. 2 through 10C, 12A to 12C, and 13A through 18B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 13A, 14A, 15A, 16A, 17A, and 18A are illustrated along reference cross-section A-A illustrated in FIG. 1, and FIGS. 8B, 9B, 10B, 13B, 14B, 15B, 16B, 16C, 17B, and 18B are illustrated along a similar cross-section B-B illustrated in FIG. 1, except for multiple fins/FinFETs. FIGS. 10C, 12A, 12B, and 12C are illustrated along reference cross-section C-C illustrated in FIG. 1, except for multiple fins/FinFETs.

Figure 2:
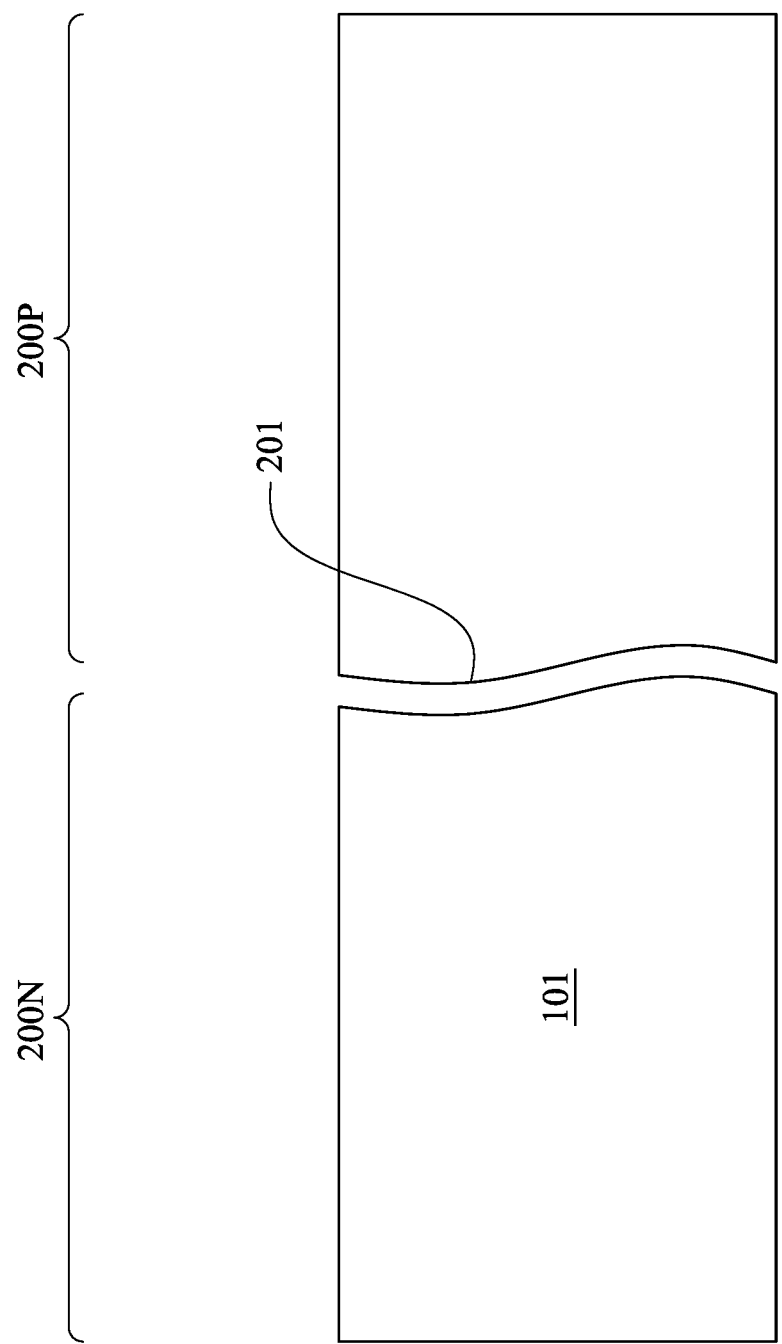
FIGS. 2, 3, 4, 5, 6, 7, 8A, 8B, 9A, 9B, 10A, 10B, and 10C are cross-sectional views of intermediate stages in the manufacturing of FinFETs, in accordance with some embodiments.

In FIG. 2, a substrate 101 is provided. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 101 has an n-type region 200N and a p-type region 200P. The n-type region 200N can be for forming n-type devices, such as NMOS transistors, e.g., n-type FinFETs. The p-type region 200P can be for forming p-type devices, such as PMOS transistors, e.g., p-type FinFETs. The n-type region 200N may be physically separated from the p-type region 200P (as illustrated by divider 201), and any number of device features (e.g., other active devices, doped regions, isolation structures, etc.) may be disposed between the n-type region 200N and the p-type region 200P.

Figure 3:
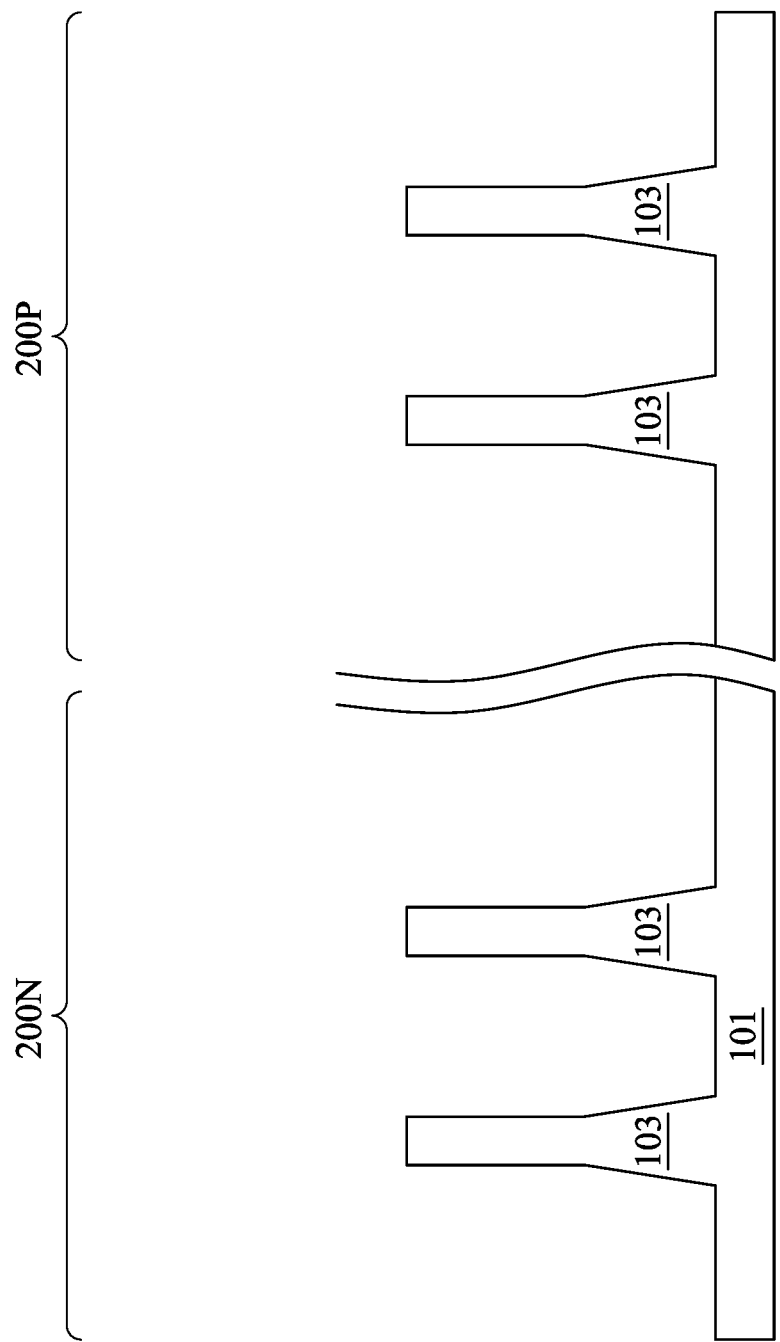

In FIG. 3, fins 103 are formed in the substrate 101. The fins 103 are semiconductor strips. In some embodiments, the fins 103 may be formed in the substrate 101 by etching trenches in the substrate 101. The etching may be any acceptable etch process, such as a reactive ion etch (RIE), neutral beam etch (NBE), the like, or a combination thereof. The etch may be anisotropic.

The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 103.

Figure 4:
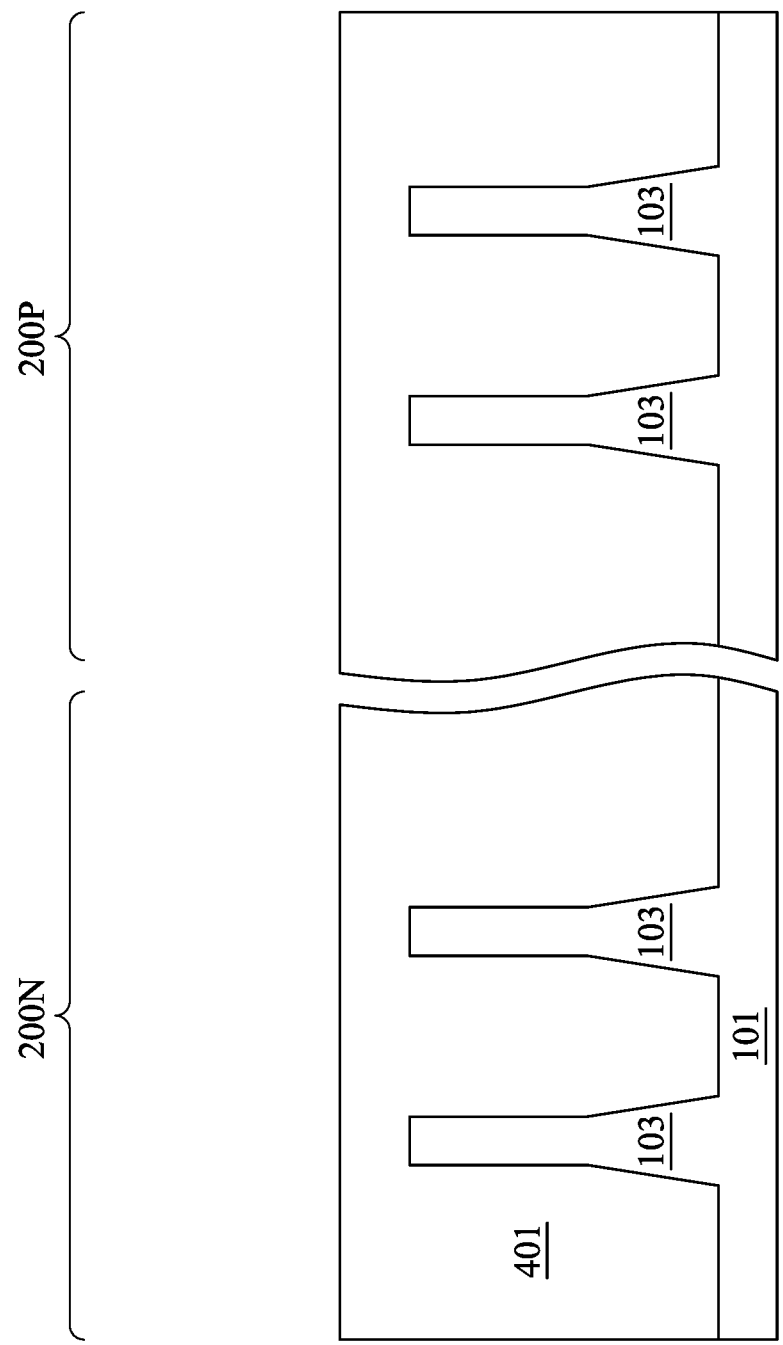

In FIG. 4, an insulation material 401 is formed over the substrate 101 and between neighboring fins 103. The insulation material 401 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 401 is silicon oxide formed by a FCVD process. An anneal process may be performed once the insulation material is formed. In an embodiment, the insulation material 401 is formed such that excess material of the insulation material 401 covers the fins 103. Although the insulation material 401 is illustrated as a single layer, some embodiments may utilize multiple layers. For example, in some embodiments a liner (not shown) may first be formed along a surface of the substrate 101 and the fins 103. Thereafter, a fill material, such as those discussed above may be formed over the liner.

Figure 5:
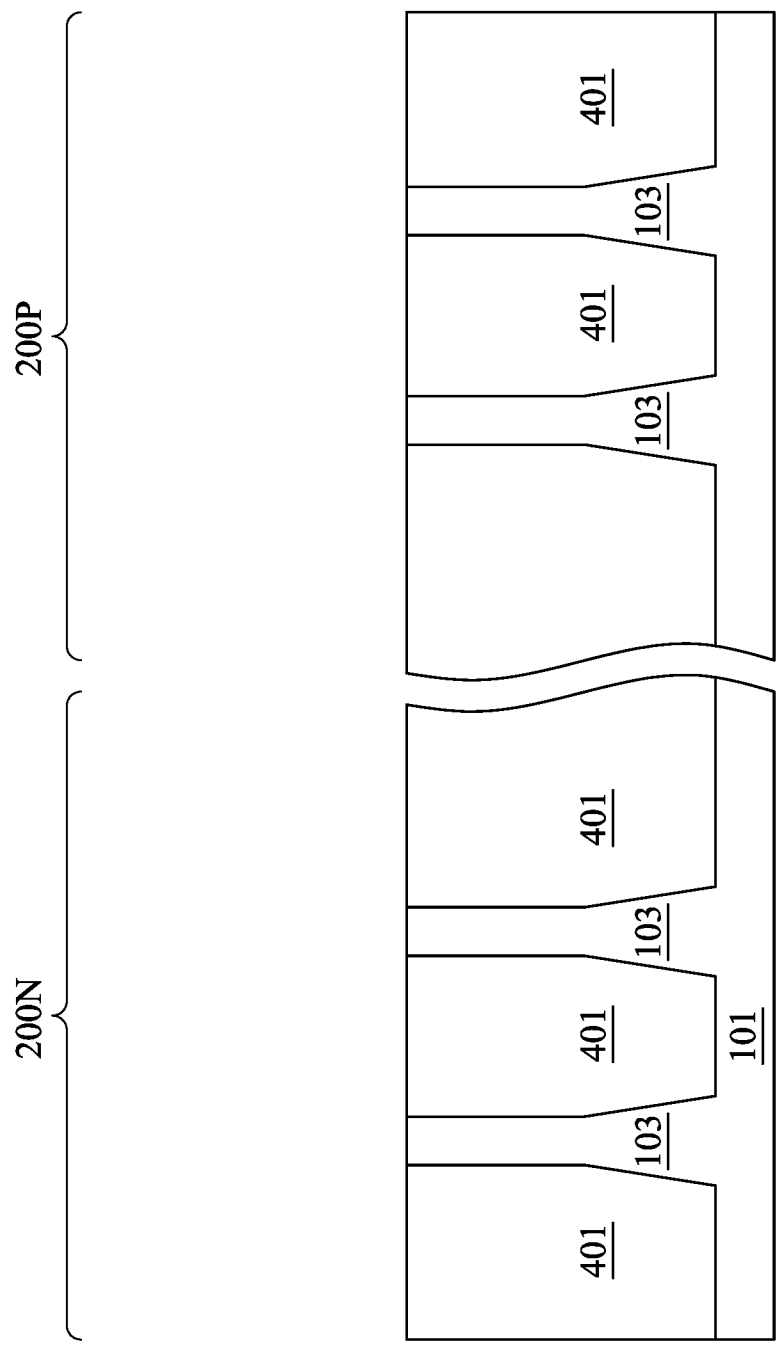

In FIG. 5, a removal process is applied to the insulation material 401 to remove the excess material of the insulation material 401 over the fins 103. In some embodiments, a planarization process such as a chemical mechanical polish (CMP), an etch-back process, combinations thereof, or the like may be utilized. The planarization process exposes the fins 103 such that top surfaces of the fins 103 and the insulation material 401 are level after the planarization process is complete. In embodiments in which a mask remains on the fins 103, the planarization process may expose the mask or remove the mask such that top surfaces of the mask or the fins 103, respectively, and the insulation material 401 are level after the planarization process is complete.

Figure 6:
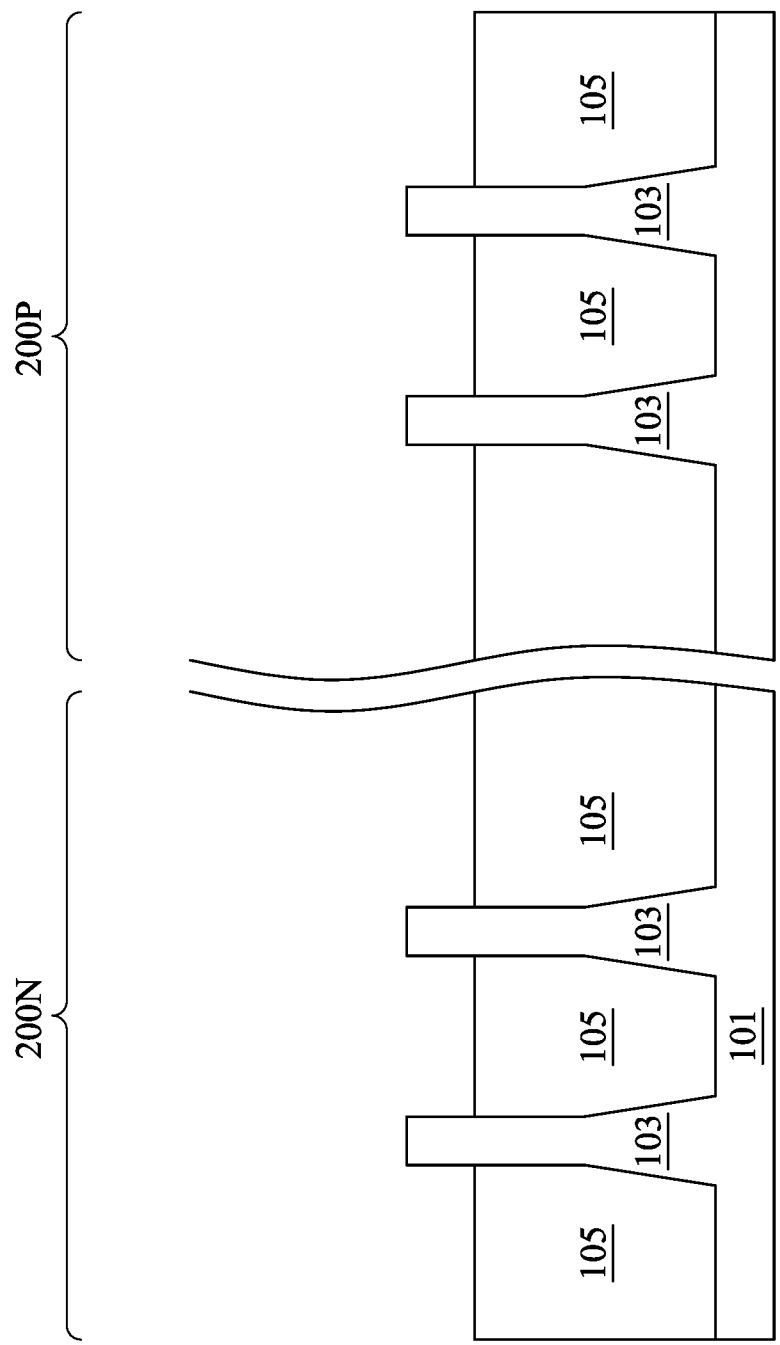

In FIG. 6, the insulation material 401 is recessed to form the STI regions 105. The insulation material 401 is recessed such that upper portions of fins 103 in the n-type region 200N and in the p-type region 200P protrude from between neighboring STI regions 105. Further, the top surfaces of the STI regions 105 may have a flat surface as illustrated, a convex surface, a concave surface (such as dishing), or a combination thereof. The top surfaces of the STI regions 105 may be formed flat, convex, and/or concave by an appropriate etch. The STI regions 105 may be recessed using an acceptable etching process, such as one that is selective to the material of the insulation material 401 (e.g., etches the material of the insulation material 401 at a faster rate than the material of the fins 103). For example, an oxide removal using, for example, dilute hydrofluoric (dHF) acid may be used.

The process described with respect to FIGS. 2 through 6 is just one example of how the fins 103 may be formed. In some embodiments, the fins may be formed by an epitaxial growth process. For example, a dielectric layer can be formed over a top surface of the substrate 101, and trenches can be etched through the dielectric layer to expose the underlying substrate 101. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 103. For example, the fins 103 in FIG. 5 can be recessed, and a material different from the fins 103 may be epitaxially grown over the recessed fins 103. In such embodiments, the fins 103 comprise the recessed material as well as the epitaxially grown material disposed over the recessed material. In an even further embodiment, a dielectric layer can be formed over a top surface of the substrate 101, and trenches can be etched through the dielectric layer. Heteroepitaxial structures can then be epitaxially grown in the trenches using a material different from the substrate 101, and the dielectric layer can be recessed such that the heteroepitaxial structures protrude from the dielectric layer to form the fins 103. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 200N (e.g., an NMOS region) different from the material in p-type region 200P (e.g., a PMOS region). In various embodiments, upper portions of the fins 103 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 103 and/or the substrate 101. In some embodiments, a P well may be formed in the n-type region 200N, and an N well may be formed in the p-type region 200P. In some embodiments, a P well or an N well are formed in both the n-type region 200N and the p-type region 200P.

In the embodiments with different well types, the different implant steps for the n-type region 200N and the p-type region 200P may be achieved using a photoresist and/or other masks (not shown). For example, a photoresist may be formed over the fins 103 and the STI regions 105 in the n-type region 200N. The photoresist is patterned to expose the p-type region 200P of the substrate 101. The photoresist can be formed by using a spin-on technique and can be patterned using acceptable photolithography techniques. Once the photoresist is patterned, an n-type impurity implant is performed in the p-type region 200P, and the photoresist may act as a mask to substantially prevent n-type impurities from being implanted into the n-type region 200N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 200P, a photoresist is formed over the fins 103 and the STI regions 105 in the p-type region 200P. The photoresist is patterned to expose the n-type region 200N of the substrate 101. The photoresist can be formed by using a spin-on technique and can be patterned using acceptable photolithography techniques. Once the photoresist is patterned, a p-type impurity implant may be performed in the n-type region 200N, and the photoresist may act as a mask to substantially prevent p-type impurities from being implanted into the p-type region 200P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 200N and the p-type region 200P, an anneal process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
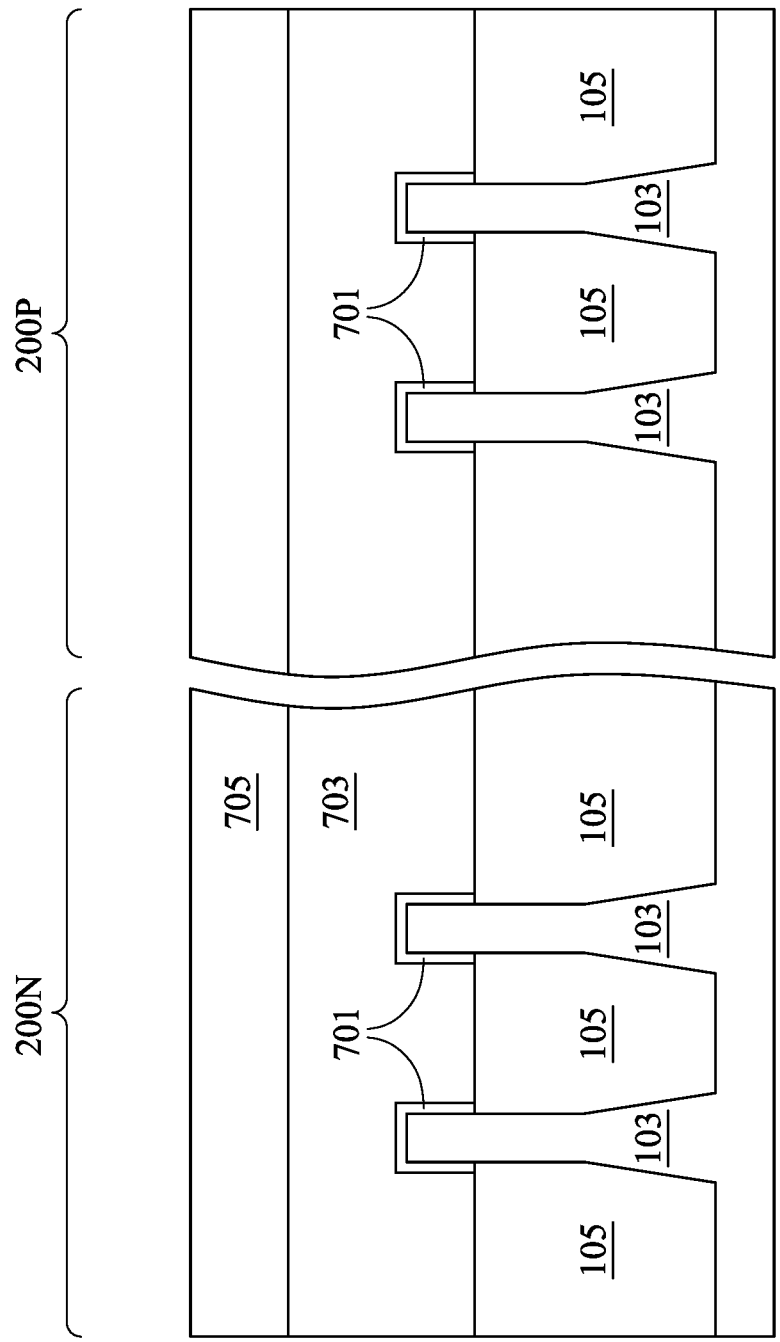

In FIG. 7, a dummy dielectric layer 701 is formed on the fins 103. The dummy dielectric layer 701 may be, for example, silicon oxide, silicon nitride, a combination thereof, or the like, and may be deposited or thermally grown according to acceptable techniques. The dummy dielectric layer 701 may be referred to herein as a dummy gate dielectric layer, a dummy gate dielectric, a dummy dielectric layer, or a dummy dielectric. A dummy gate layer 703 is formed over the dummy dielectric layer 701, and a mask layer 705 is formed over the dummy gate layer 703. The dummy gate layer 703 may be deposited over the dummy dielectric layer 701 and then planarized, such as by a CMP. The mask layer 705 may be deposited over the dummy gate layer 703. The dummy gate layer 703 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 703 may be deposited by physical vapor deposition (PVD), CVD, sputter deposition, or other techniques for depositing the selected material. The dummy gate layer 703 may be made of other materials that have a high etching selectivity from the etching of isolation regions, e.g., the STI regions 105 and/or the dummy dielectric layer 701. The mask layer 705 may include one or more layers of, for example, silicon nitride, silicon oxynitride, or the like. In this example, a single dummy gate layer 703 and a single mask layer 705 are formed across the n-type region 200N and the p-type region 200P. It is noted that the dummy dielectric layer 701 is shown covering only the fins 103 for illustrative purposes only. In some embodiments, the dummy dielectric layer 701 may be deposited such that the dummy dielectric layer 701 covers the STI regions 105, extending over the STI regions and between the dummy gate layer 703 and the STI regions 105.

FIGS. 8A to 10C illustrate various additional steps in the manufacturing of embodiment devices. FIGS. 8A to 10C illustrate features in either of the n-type region 200N and the p-type region 200P. For example, the structures illustrated in FIGS. 8A to 10C may be applicable to both the n-type region 200N and the p-type region 200P. Differences (if any) in the structures of the n-type region 200N and the p-type region 200P are described in the text accompanying each figure.

Figure 8B:
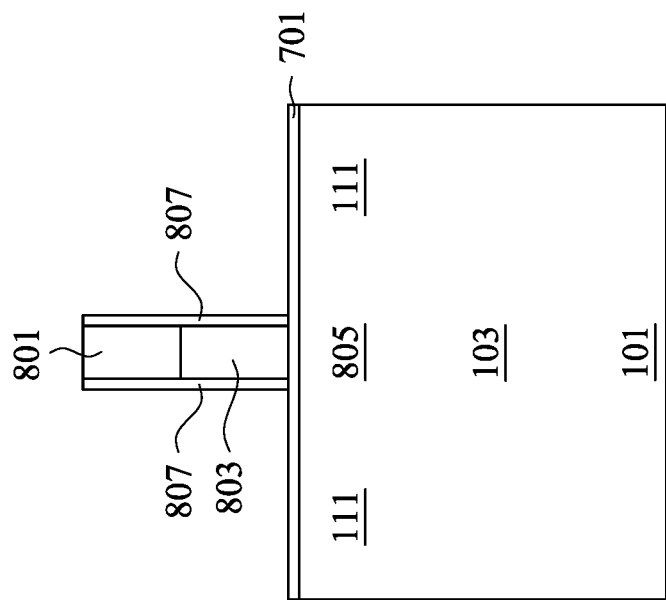
Figure 8A:
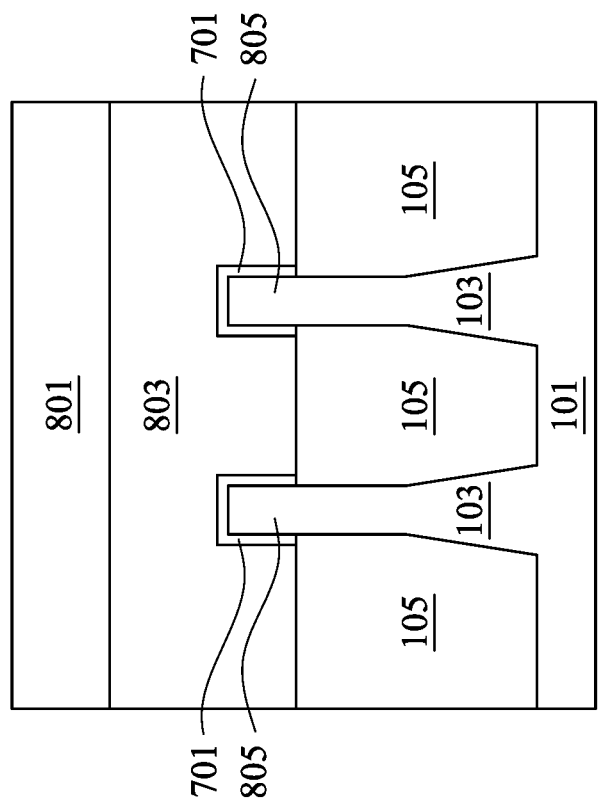

In FIGS. 8A and 8B, the mask layer 705 (see FIG. 7) may be patterned using acceptable photolithography and etching techniques to form masks 801. The pattern of the masks 801 then may be transferred to the dummy gate layer 703. In some embodiments (not illustrated), the pattern of the masks 801 may also be transferred to the dummy dielectric layer 701 by an acceptable etching technique to form dummy gates 803. The dummy gates 803 cover respective ones of the channel regions 805 of the fins 103. The pattern of the masks 801 may be used to physically separate each of the dummy gates 803 from adjacent dummy gates. The dummy gates 803 may also have a lengthwise direction substantially perpendicular to the lengthwise direction of respective ones of the fins 103.

Further in FIGS. 8A and 8B, gate seal spacers 807 can be formed on exposed surfaces of the dummy gates 803, the masks 801, and/or the fins 103. A thermal oxidation or a deposition followed by an anisotropic etch may form the gate seal spacers 807. The gate seal spacers 807 may be formed of silicon oxide, silicon nitride, silicon oxynitride, or the like.

After the formation of the gate seal spacers 807, implants for lightly doped source/drain (LDD) regions (not explicitly illustrated) may be performed. In the embodiments with different device types, similar to the implants discussed above in FIG. 6, a mask, such as a photoresist, may be formed over the n-type region 200N, while exposing the p-type region 200P, and appropriate type (e.g., p-type) impurities may be implanted into the exposed fins 103 in the p-type region 200P. The mask may then be removed. Subsequently, a mask, such as a photoresist, may be formed over the p-type region 200P while exposing the n-type region 200N, and appropriate type impurities (e.g., n-type) may be implanted into the exposed fins 103 in the n-type region 200N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $Cm^{-3}$ to about $10^{19}$ $Cm^{-3}$. An anneal process may be used to repair implant damage and to activate the implanted impurities.

Figure 9B:
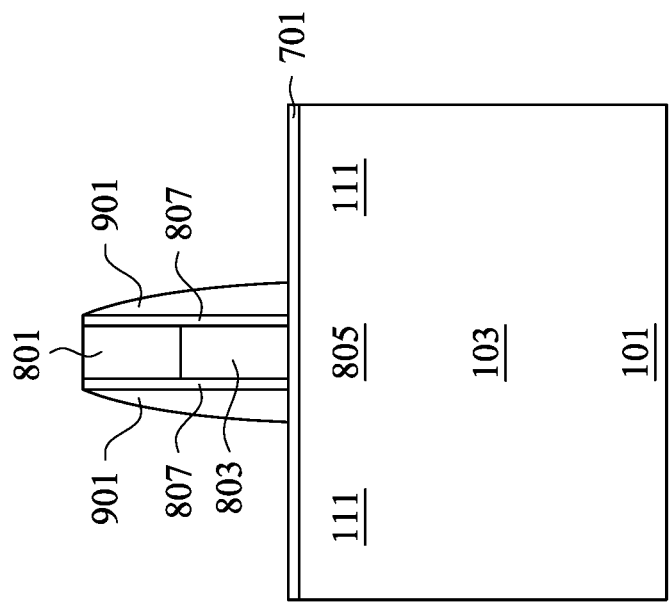
Figure 9A:
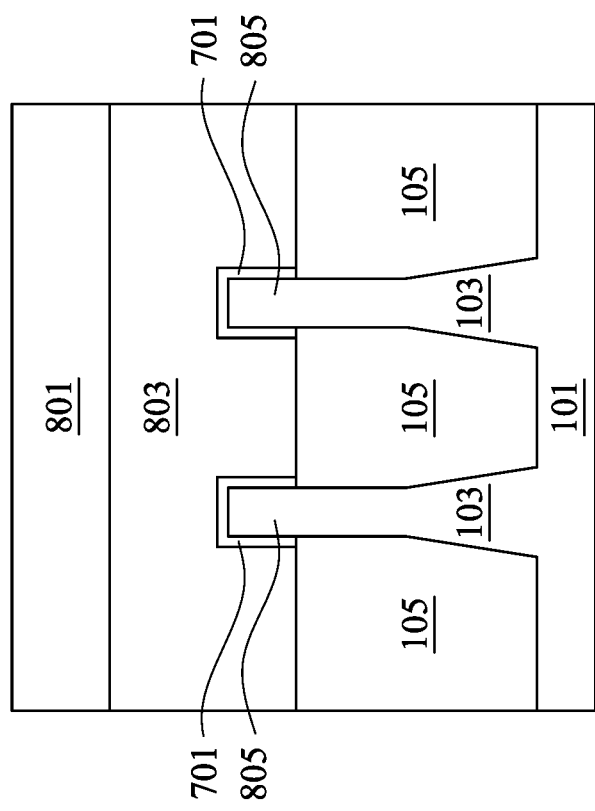

In FIGS. 9A and 9B, gate spacers 901 are formed on the gate seal spacers 807 along sidewalls of the dummy gates 803 and the masks 801. The gate spacers 901 may be formed by conformally depositing an insulating material and subsequently anisotropically etching the insulating material. The insulating material of the gate spacers 901 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 807 may not be etched prior to forming the gate spacers 901, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 807 while the LDD regions for p-type devices may be formed after forming the gate seal spacers 807.

Figure 10B:
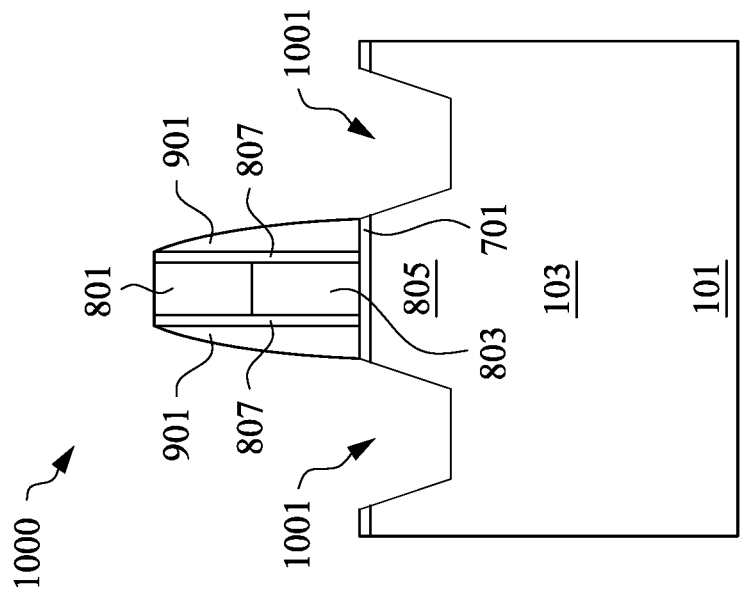
Figure 10A:
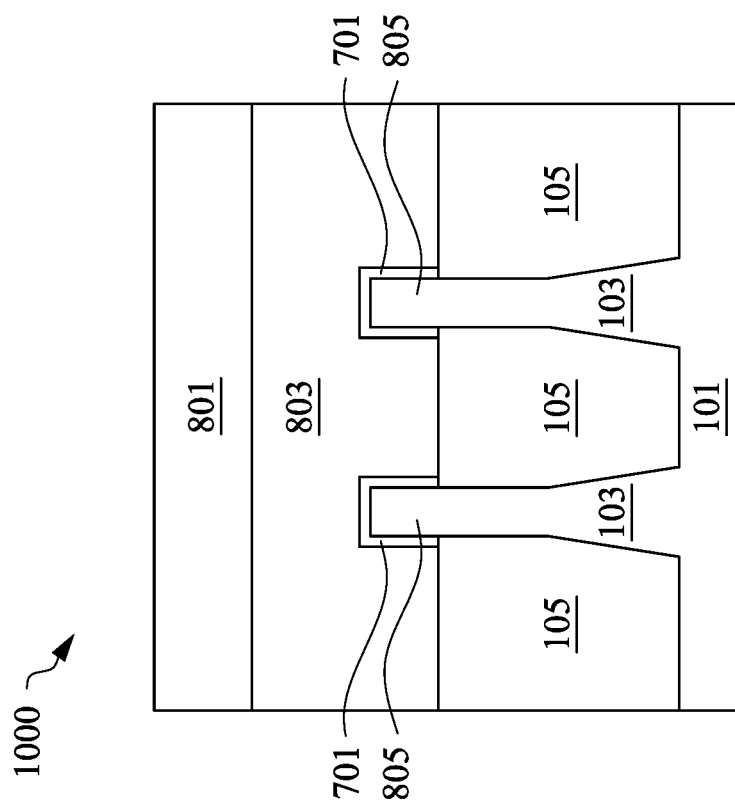
Figure 10C:
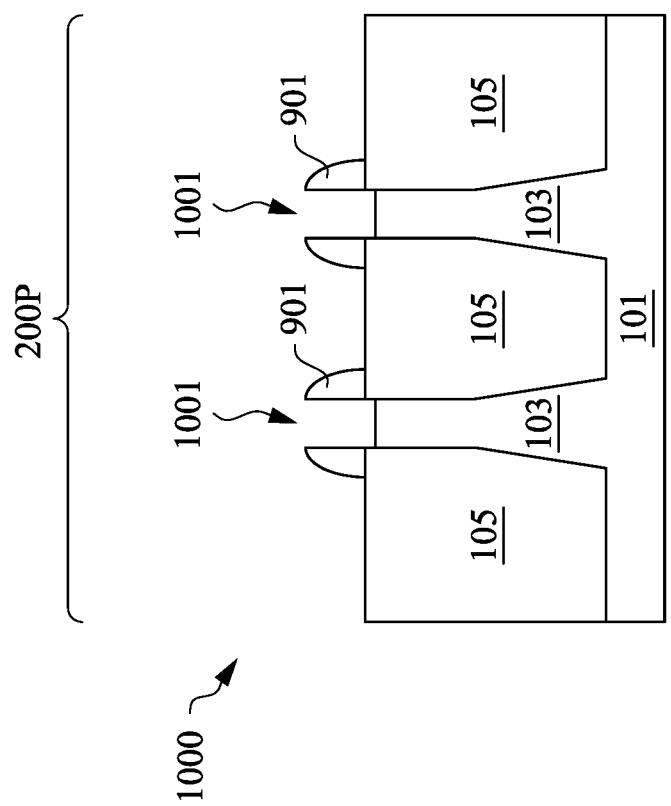

FIGS. 10A through 10C illustrate an intermediate structure 1000 in the formation of the first FinFETs 100, according to some embodiments. In particular, FIGS. 10A through 10C illustrate a patterning process to form first openings 1001 in the source/drain regions 111 of the fins 103 for the p-type region 200P, in accordance with some embodiments. The patterning process, according to some embodiments, comprises applying one or more masks and a photoresist over the n-type region 200N and then developing and etching the photoresist to form a mask over the intermediate structures illustrated in FIGS. 9A and 9B. Once formed, the mask is then used during an etching process to transfer the pattern of the mask into the underlying layers and form the first openings 1001 in the source/drain regions 111 of the fins 103. In the illustrated embodiment, the first openings 1001 are formed through the dummy dielectric layer 701 and into the materials of the fins 103 using an anisotropic etching process. The etching process may be a wet etch, a dry etch, combinations, or the like and may be performed using any suitable anisotropic etching process, isotropic etching process, combinations, or the like. Furthermore, the first openings 1001 may be formed to any suitable size and shape for forming such openings.

FIG. 10B further illustrates, with respect to the cutline along reference cross-section B-B illustrated in FIG. 1, the first openings 1001 being formed such that each dummy gate 803 is disposed between respective neighboring pairs of the first openings 1001. FIG. 10B also illustrates that the first openings 1001 are formed through the dummy dielectric layer 701 and into the materials of the fins 103 with an anisotropic etch, according to some embodiments.

FIG. 10C illustrates, with respect to the cutline along reference cross-section C-C illustrated in FIG. 1, the first openings 1001 being formed between the gate spacers 901 and recessing the fins 103 below a level of the STI regions 105, according to some embodiments. However, the first openings 1001 may also be formed to a level of the STI regions 105 or may be formed to any suitable level below the STI regions 105 or even formed through the fins 103. All such levels of recessing of the fins 103 are within the scopes of the embodiments.

Figure 11A:
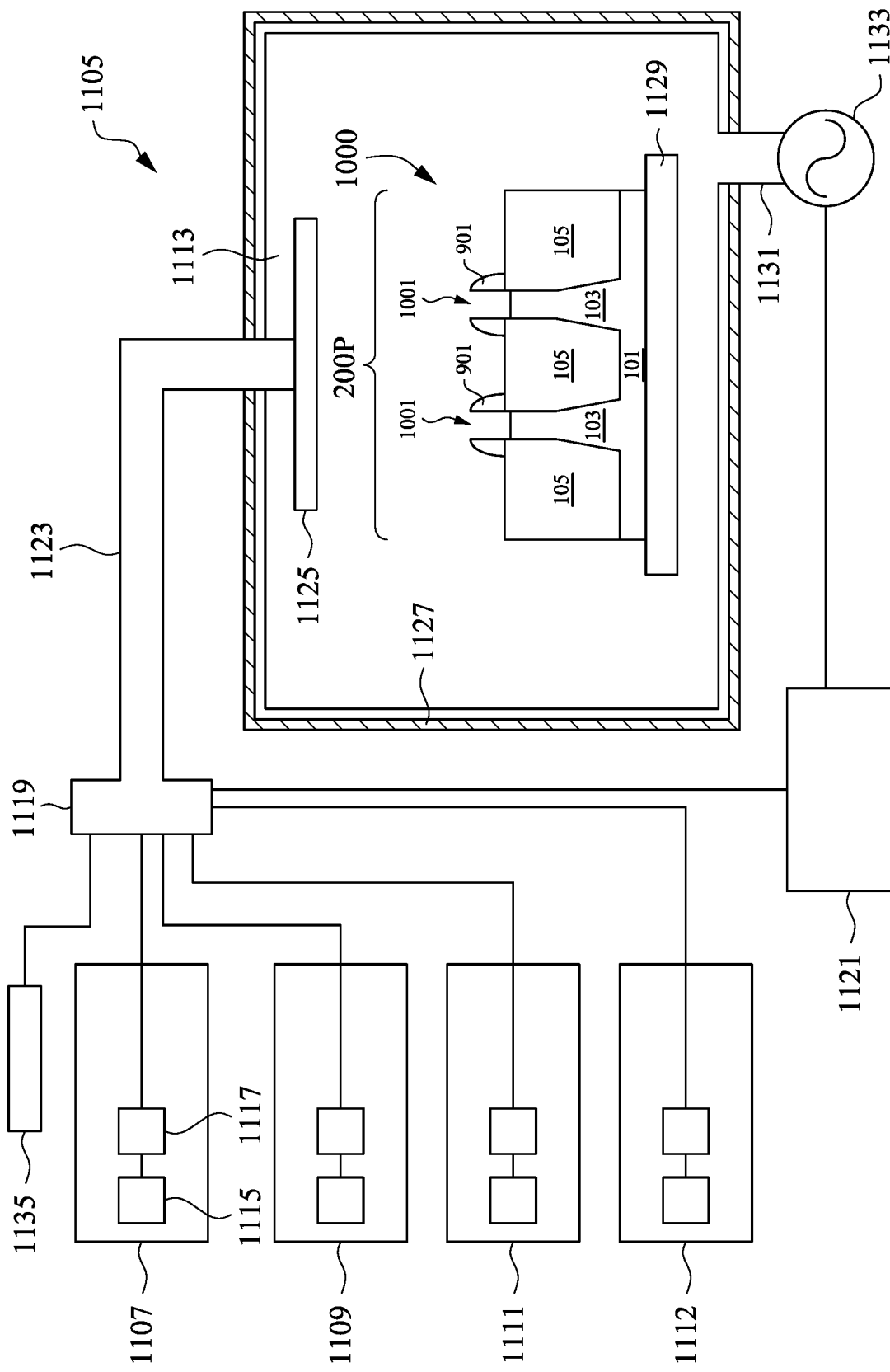
FIGS. 11A and 11B illustrate a deposition and etching system used in the formation of FinFETs, in accordance with some embodiments.
Figure 11B:
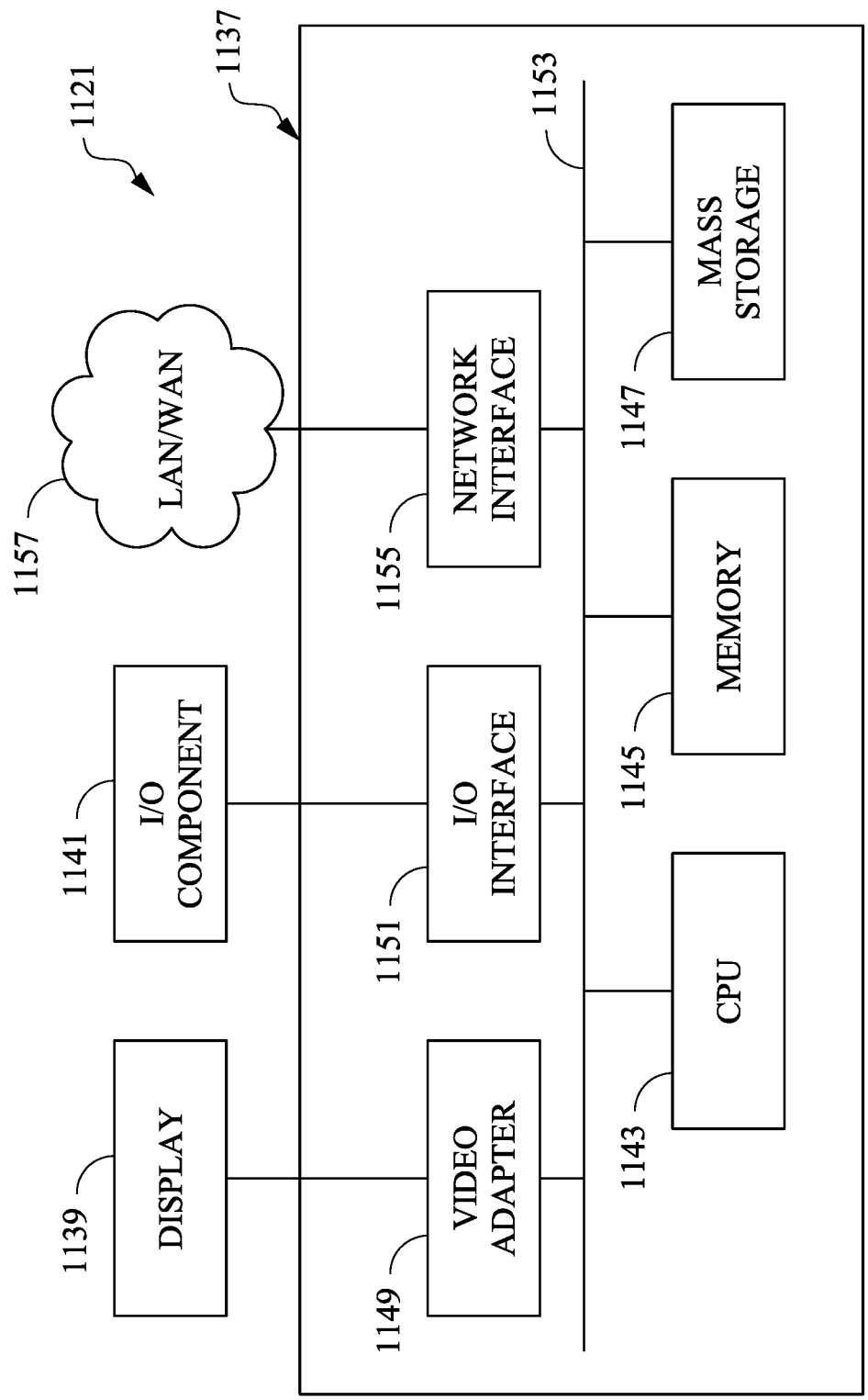

Turning to FIGS. 11A and 11B, these figures illustrate a deposition system 1105 used in various steps of manufacturing of embodiment devices as described herein. The deposition system 1105 may be utilized to receive precursor materials from a first precursor delivery system 1107, a second precursor delivery system 1109, a third precursor delivery system 1111, and an etching precursor delivery system 1112, and to form layers of materials in the first openings 1001 between the gate spacers 901. In an embodiment the first precursor delivery system 1107, the second precursor delivery system 1109, the third precursor delivery system 1111, and the etching precursor delivery system 1112 may work in conjunction with one another to supply the various different precursor materials and etching materials to a deposition chamber 1113 wherein the intermediate structure 1000 is placed. However, the first precursor delivery system 1107, the second precursor delivery system 1109, the third precursor delivery system 1111, and the etching precursor delivery system 1112 may have physical components that are similar with each other.

For example, the first precursor delivery system 1107, the second precursor delivery system 1109, the third precursor delivery system 1111, and the etching precursor delivery system 1112 may each include a gas supply 1115 and a flow controller 1117 (labeled in FIG. 11A with regards to the first precursor delivery system 1107 but not labeled for clarity with respect to the second precursor delivery system 1109, the third precursor delivery system 1111, the etching precursor delivery system 1112). In an embodiment in which the first precursor is stored in a gaseous state, the gas supply 1115 may supply the first precursor to the deposition chamber 1113. The gas supply 1115 may be a vessel, such as a gas storage tank, that is located either locally to the deposition chamber 1113 or else may be located remotely from the deposition chamber 1113. In other embodiments, the gas supply 1115 may be a facility that independently prepares and delivers the first precursor to the flow controller 1117. Any suitable source for the first precursor may be utilized as the gas supply 1115, and all such sources are fully intended to be included within the scope of the embodiments.

The gas supply 1115 may supply the desired precursor to the flow controller 1117. The flow controller 1117 may be utilized to control the flow of the precursor to a precursor gas controller 1119 and, eventually, to the deposition chamber 1113, thereby also helping to control the pressure within the deposition chamber 1113. The flow controller 1117 may be, e.g., a proportional valve, a modulating valve, a needle valve, a pressure regulator, a mass flow controller, combinations of these, or the like. However, any suitable method for controlling and regulating the flow of the carrier gas to a precursor canister (not separately illustrated) may be utilized, and all such components and methods are fully intended to be included within the scope of the embodiments.

However, as one of ordinary skill in the art will recognize, while the first precursor delivery system 1107, the second precursor delivery system 1109, the third precursor delivery system 1111, and the etching precursor delivery system 1112 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 1105, may be utilized. All such precursor systems are fully intended to be included within the scope of the embodiments.

Additionally, in an embodiment in which the first precursor is stored in a solid or liquid state, the gas supply 1115 may store a carrier gas (e.g., hydrogen $H_2$) and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 1119. Any suitable method and combination of units may be utilized to provide the first precursor, and all such combinations of units are fully intended to be included within the scope of the embodiments.

The first precursor delivery system 1107, the second precursor delivery system 1109, the third precursor delivery system 1111, the etching precursor delivery system 1112 may supply their individual precursor materials into the precursor gas controller 1119. The precursor gas controller 1119 connects and isolates the first precursor delivery system 1107, the second precursor delivery system 1109, the third precursor delivery system 1111, and the etching precursor delivery system 1112 from the deposition chamber 1113 in order to deliver the desired precursor materials to the deposition chamber 1113. The precursor gas controller 1119 may include such devices as valves, flow meters, sensors, and the like to control the delivery rates of each of the precursors, and may be controlled by instructions received from a control unit 1121 (described further below with respect to FIG. 11B).

The precursor gas controller 1119, upon receiving instructions from the control unit 1121, may open and close valves so as to connect one of the first precursor delivery system 1107, the second precursor delivery system 1109, the third precursor delivery system 1111, and the etching precursor delivery system 1112 to the deposition chamber 1113 and direct a desired precursor material through a manifold 1123, into the deposition chamber 1113, and to a showerhead 1125. The showerhead 1125 may be utilized to disperse the chosen precursor material into the deposition chamber 1113 and may be designed to evenly disperse the precursor material in order to minimize undesired process conditions that may arise from uneven dispersal. In an embodiment the showerhead 1125 may have a circular design with openings dispersed evenly around the showerhead 1125 to allow for the dispersal of the desired precursor material into the deposition chamber 1113.

However, as one of ordinary skill in the art will recognize, the introduction of precursor materials to the deposition chamber 1113 through a single showerhead 1125 or through a single point of introduction as described above is intended to be illustrative only and is not intended to be limiting to the embodiments. Any number of separate and independent showerheads 1125 or other openings to introduce precursor materials into the deposition chamber 1113 may be utilized. All such combinations of showerheads 1125 and other points of introduction are fully intended to be included within the scope of the embodiments.

The deposition chamber 1113 may receive the desired precursor materials and expose the precursor materials to the fins 103 at the bottoms of the first openings 1001. The deposition chamber 1113 may be any desired shape that may be suitable for dispersing the precursor materials and contacting the precursor materials with the fins 103. In the embodiment illustrated in FIG. 11A, the deposition chamber 1113 has a cylindrical sidewall and a bottom. However, the deposition chamber 1113 is not limited to a cylindrical shape, and any other suitable shape, such as a hollow square tube, an octagonal shape, or the like, may be utilized. Furthermore, the deposition chamber 1113 may be surrounded by a housing 1127 made of material that is inert to the various process materials. As such, while the housing 1127 may be any suitable material that can withstand the chemistries and pressures involved in the deposition process, in an embodiment the housing 1127 may be steel, stainless steel, nickel, aluminum, alloys of these, combinations of these, and like.

Within the deposition chamber 1113 the intermediate structure 1000 may be placed on a mounting platform 1129 in order to position and control the intermediate structure 1000 during the deposition process. The mounting platform 1129 may include heating mechanisms in order to heat the intermediate structure 1000 during the deposition process. Furthermore, while a single mounting platform 1129 is illustrated in FIG. 11A, any number of mounting platforms 1129 may additionally be included within the deposition chamber 1113.

Additionally, the deposition chamber 1113 and the mounting platform 1129 may be part of a cluster tool system (not shown). The cluster tool system may be used in conjunction with an automated handling system in order to position and place the intermediate structure 1000 into the deposition chamber 1113 prior to the deposition and/or etching processes, position, hold the intermediate structure 1000 during the deposition and/or etching processes, and remove the intermediate structure 1000 from the deposition chamber 1113 after the deposition and/or etching processes have been completed.

The deposition chamber 1113 may also have an exhaust outlet 1131 for exhaust gases to exit the deposition chamber 1113. A vacuum pump 1133 may be connected to the exhaust outlet 1131 in order to help evacuate the exhaust gases from the deposition chamber 1113. The vacuum pump 1133, under control of the control unit 1121, may also be utilized to reduce and control the pressure within the deposition chamber 1113 to a desired pressure.

FIG. 11A further illustrates a purge gas delivery system 1135. In an embodiment the purge gas delivery system 1135 may be a gaseous tank or other facility that provides a purge gas such as nitrogen, argon, xenon, or other non-reactive gas to the deposition chamber 1113. Furthermore, the purge gas delivery system 1135 and/or the vacuum pump 1133, under control of the control unit 1121, may also be utilized to evacuate precursor materials from the deposition chamber 1113 in preparation for the introduction of the next precursor material.

FIG. 11B illustrates an embodiment of the control unit 1121 that may be utilized to control the precursor gas controller 1119 and the vacuum pump 1133. The control unit 1121 may be any form of computer processor that can be used in an industrial setting for controlling process machines. In an embodiment the control unit 1121 may comprise a processing unit 1137, such as a desktop computer, a workstation, a laptop computer, or a dedicated unit customized for a particular application. The control unit 1121 may be equipped with a display 1139 and input/output (I/O) components 1141, such as instruction outputs, sensor inputs, a mouse, a keyboard, printer, combinations of these, or the like. The processing unit 1137 may include a central processing unit (CPU) 1143, memory 1145, a mass storage device 1147, a video adapter 1149, and an I/O interface 1151 connected to a bus 1153.

The bus 1153 may be one or more of any type of several bus architectures including a memory bus or memory controller, a peripheral bus, or video bus. The CPU 1143 may comprise any type of electronic data processor, and the memory 1145 may comprise any type of system memory, such as static random access memory (SRAM), dynamic random access memory (DRAM), or read-only memory (ROM). The mass storage device 1147 may comprise any type of storage device configured to store data, programs, and other information and to make the data, programs, and other information accessible via the bus 1153. The mass storage device 1147 may comprise, for example, one or more of a hard disk drive, a magnetic disk drive, or an optical disk drive.

The video adapter 1149 and the I/O interface 1151 provide interfaces to couple external input and output devices to the processing unit 1137. As illustrated in FIG. 11B, examples of input and output devices include the display 1139 coupled to the video adapter 1149 and the I/O components 1141, such as a mouse, keyboard, printer, and the like, coupled to the I/O interface 1151. Other devices may be coupled to the processing unit 1137 and additional or fewer interface cards may be utilized. For example, a serial interface card (not shown) may be used to provide a serial interface for a printer. The processing unit 1137 also may include a network interface 1155 that may be a wired link to a local area network (LAN) or a wide area network (WAN) 1157 and/or a wireless link.

It should be noted that the control unit 1121 may include other components. For example, the control unit 1121 may include power supplies, cables, a motherboard, removable storage media, cases, and the like. These other components, although not shown in FIG. 11B, are considered part of the control unit 1121.

FIGS. 12A to 18B illustrate further steps in the manufacturing of embodiment devices, some of which may be performed in the deposition system 1105. Furthermore, FIGS. 12A to 18B illustrate features in either of the n-type region 200N and the p-type region 200P. For example, the structures illustrated in FIGS. 12A to 18B may be applicable to both the n-type region 200N and the p-type region 200P. Differences (if any) in the structures of the n-type region 200N and the p-type region 200P are described in the text accompanying each figure.

Figure 12A:
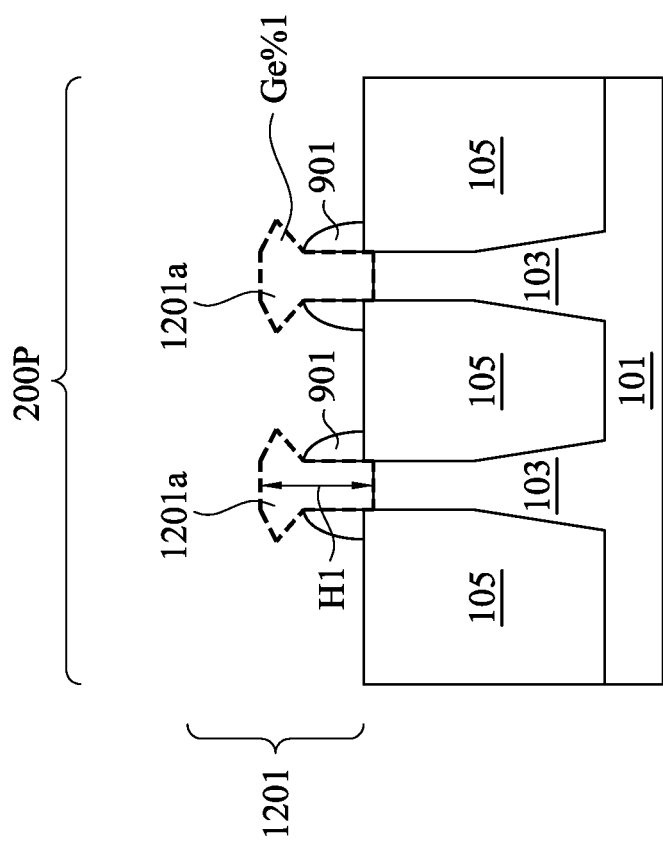
FIGS. 12A, 12B, and 12C are cross-sectional views of further intermediate stages in the manufacturing of FinFETs, in accordance with some embodiments.
Figure 12B:
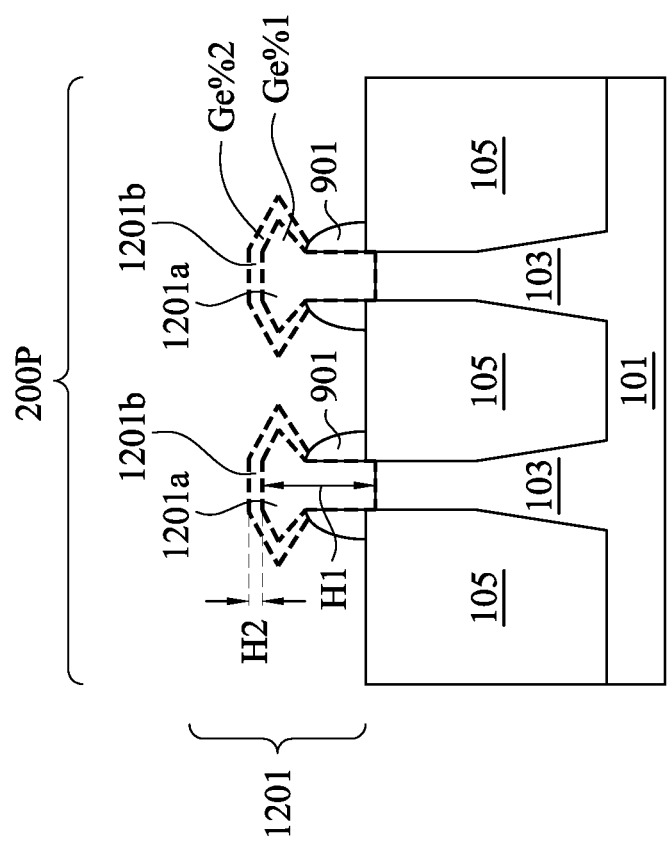
Figure 12C:
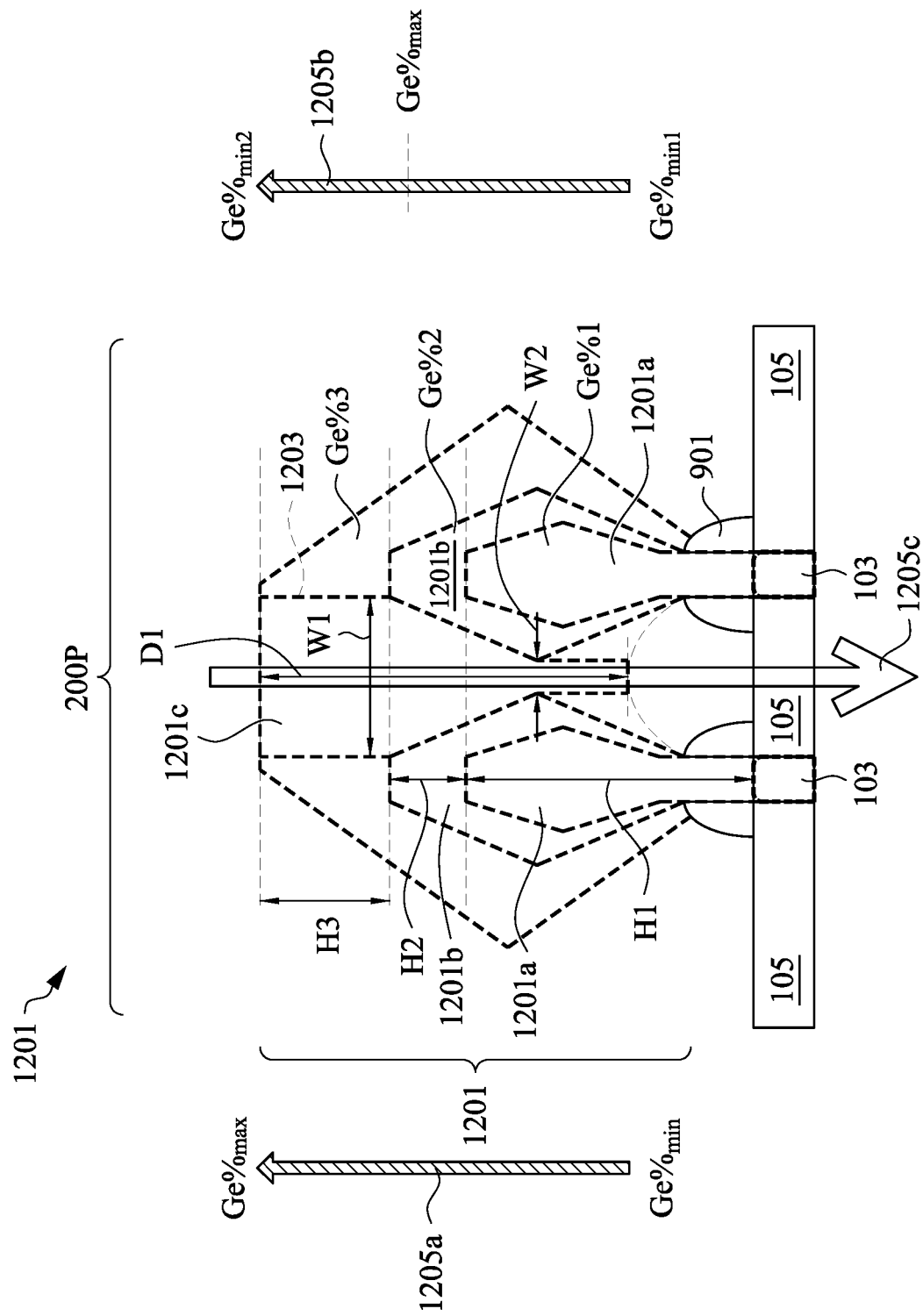

In FIGS. 12A to 12C, these figures illustrate with respect to reference cross-section C-C intermediate stages of forming multilayer source/drain regions 1201 in accordance with some embodiments. The multilayer source/drain regions 1201 may be epitaxially grown in the deposition chamber 1113 using any acceptable material, such as appropriate for the first FinFETs 100. For example, if the fins 103 are silicon, the multilayer source/drain regions 1201 in the p-type region 200P may comprise materials exerting a compressive strain in the channel region 805, such as boron doped silicon-germanium, silicon-germanium, germanium, germanium tin, or the like. The multilayer source/drain regions 1201 in the p-type region 200P may have surfaces that are raised from respective surfaces of the fins 103. Furthermore, the multilayer source/drain regions 1201 may have any acceptable shape such as, diamond shapes, round shapes, square shapes, rectangular shapes, or the like. The multilayer source/drain regions 1201 may also have faceted surfaces, flat surfaces, round surfaces, irregular surfaces, rough surfaces, smooth surfaces, or the like.

The layers of the multilayer source/drain regions 1201 may be formed in the deposition chamber 1113 by initially placing the intermediate structure 1000 in the deposition chamber 1113. In embodiments in which the multilayer source/drain regions 1201 are to be formed as boron doped silicon-germanium structures, the first precursor material may be a source material such as silane ($SiH_4$), dichlorosilane or DCS ($SiH_2Cl_2$), trichlorosilane ($SiHCl_3$), tetrachlorosilane ($SiCl_4$), or the like and the first precursor material is placed into the first precursor delivery system 1107. The second precursor material may be a source material such as germane ($GeH_4$), digermane ($Ge_2H_6$), or the like and the second precursor material is placed into the second precursor delivery system 1109. The third precursor material may be a source material such as diborane ($B_2H_6$), or the like and the third precursor material is placed into the third precursor delivery system 1111. The etching precursor material may be a source material such as hydrogen chloride (HCl), chlorine ($Cl_2$), or the like and the etching precursor material is placed into the etching precursor delivery system 1112. However, as one of ordinary skill in the art will recognize, the source materials listed above are not the only precursor materials that may be utilized to form boron doped silicon germanium, and the use of these source materials is not intended to be limiting to the embodiments. Any suitable precursor materials in any suitable phase (solid, liquid, or gas) may be utilized.

FIG. 12A illustrates first epitaxial growth layers 1201a are formed in the first openings 1001 of the p-type region 200P according to some embodiments. The first epitaxial growth layers 1201a may be formed as boron doped silicon germanium structures using dichlorosilane ($SiH_2Cl_2$) or silane ($SiH_4$) as the first precursor and using germane ($GeH_4$) or digermane ($Ge_2H_6$) as the second precursor, according to some embodiments. In such embodiments, the control unit 1121 may direct the flow controller 1117 of the first precursor delivery system 1107 to flow the first precursor into the deposition chamber 1113 at a first flow rate fr1 of between about 10 sccm and about 200 sccm and direct the flow controller 1117 of the second precursor delivery system 1109 to flow the second precursor into the deposition chamber 1113 at a second flow rate fr2 of between about 10 sccm and about 1000 sccm. However, any suitable flow rates may be used. A first flow rate ratio R1 may be calculated as a ratio of the second flow rate fr2 to the first flow rate fr1 (e.g., R1=fr2/fr1). According to some embodiments, the first flow rate ratio R1 is a ratio between about 1:1 and about 50:1. However, any suitable flow rate may be used.

Furthermore, hydrogen ($H_2$) may be used as a carrier gas, according to some embodiments. For each precursor that uses a carrier gas, the control unit 1121 may control the flow to flow the carrier gas at a fifth rate of between about 1 slm and about 40 slm. Furthermore, during deposition of the first epitaxial growth layers 1201a, the deposition chamber 1113 may be maintained within a process temperature range of between about 400° C. and about 700° C. and within a process pressure range of between about 1 Torr and about 100 Torr. However, any suitable carrier gases, process temperatures and process pressures may be used.

The first epitaxial growth layers 1201a may be doped in situ during growth or may be doped by implantation after growth. In embodiments in which the first epitaxial growth layers 1201a are doped in situ during growth, diborane ($B_2H_6$) may be used as the third precursor. In such embodiments, the control unit 1121 may direct the flow controller 1117 of the third precursor delivery system 1111 to flow the third precursor into the deposition chamber 1113 at a third flow rate of between about 10 sccm and about 200 sccm. In embodiments in which the first epitaxial growth layers 1201a are doped by implantation after growth, the p-type dopants may be implanted using an acceptable process such as ion implantation. In such embodiments, the p-type dopants may be implanted after growth to the first epitaxial growth layers 1201a and before further layers of the multilayer source/drain regions 1201 are formed over the first epitaxial growth layers 1201a. However, the p-type dopants may also be implanted after all of the epitaxial growth layers of the multilayer source/drain regions 1201 have been formed.

In some embodiments, hydrogen chloride (HCl) or chlorine ($Cl_2$) may be used as the etching precursor to control the epitaxial growth and shape of the first epitaxial growth layers 1201a. In such embodiments, the control unit 1121 may direct the flow controller 1117 of the etching precursor delivery system 1112 to flow the etching precursor into the deposition chamber 1113 at a fourth flow rate of between about 10 sccm and about 300 sccm. In the illustrated embodiment of FIG. 12A, the first epitaxial growth layers 1201a are formed with first diamond shapes having first faceted surfaces with top surfaces being flat. Furthermore, the first epitaxial growth layers 1201a are formed separated from one another, according to some embodiments. In other embodiments, the first epitaxial growth layers 1201a may be formed merged together.

Furthermore, in embodiments in which the first epitaxial growth layers 1201a are grown as boron doped silicon germanium structures, the first epitaxial growth layers 1201a are grown having a first concentration ratio (Ge %1). The first concentration ratio (Ge %1) represents a concentration level of germanium (Ge) to a concentration level of silicon (Si) of the first epitaxial growth layers 1201a and can be expressed as $Si_{(1-x)}Ge_x$:B, where x is a decimal representing a percentage concentration by volume of germanium (Ge) and B indicates the p-type dopant (e.g., boron (B)).

Further still, the first epitaxial growth layers 1201a may be formed with a relatively low concentration of germanium to a concentration of silicon. A low percentage concentration of germanium (Ge %) is within a first range of concentrations by volume where 0%≤Ge %<50%. According to some embodiments, the first concentration ratio (Ge %1) represents a constant concentration level of germanium (Ge) throughout the structures of the first epitaxial growth layers 1201a. In other embodiments, the first concentration ratio (Ge %1) represents a gradient of concentration levels of germanium (Ge) throughout the structures of the first epitaxial growth layers 1201a. For example, the structures of the first epitaxial growth layers 1201a may have a concentration level gradient for which the concentration level of germanium increases as a distance from the fins 103 increases. As such, the gradient of concentration levels of germanium (Ge) may go from 0% at the bottom of the first epitaxial growth layers 1201a which interface the fins 103 to about 50% at the top of the first epitaxial growth layers 1201a. In such embodiments, the concentration level gradient may be formed during growth by tuning one or more of the flow rates of the first precursor and the second precursor to increase the percentage concentration of germanium.

The first epitaxial growth layers 1201a may be formed using a first timed deposition process and the first flow rate ratio R1 for a time period of between about 50 seconds and about 500 seconds, in accordance with some embodiments. However, any suitable time period may be used. According to some embodiments, the first epitaxial growth layers 1201a are formed over the fins 103 to a first height H1. The first height H1 may be between about 10 nm and about 50 nm, according to some embodiments. However, any suitable height may be used. The first epitaxial growth layers 1201a may be referred to herein as first layers, bottom layers, first source/drain layers, bottom source/drain layers, or the like.

Turning to FIG. 12B, this figure illustrates the formation of second epitaxial growth layers 1201b over the first epitaxial growth layers 1201a, according to some embodiments. The second epitaxial growth layers 1201b are formed with a second concentration ratio (Ge %2) of a relatively low concentration of germanium that is within a second range of concentrations by volume where 0%≥Ge %2<50%, in accordance with some embodiments. In such embodiments, the second concentration ratio (Ge %2) of the second epitaxial growth layers 1201b may also be greater than or equal to the greatest level of concentration of the first concentration ratio (Ge %1) of the first epitaxial growth layers 1201a. The second epitaxial growth layers 1201b may be grown with the second concentration ratio (Ge %2) by tuning the flow rates of the first precursor and the second precursor during growth. In some embodiments, the second concentration ratio (Ge %2) may be a constant concentration level of germanium (Ge) throughout the structure of the second epitaxial growth layers 1201b. In other embodiments, the second concentration ratio (Ge %2) may be a gradient of concentration levels of germanium (Ge) that increases as a distance from the first epitaxial growth layers 1201a increases. In such embodiments, the second concentration level of germanium (Ge %2) may be formed during growth by tuning one or more of the flow rates of the first precursor and the second precursor used in the forming of the first epitaxial growth layers 1201a to increase the percentage concentration of germanium during the growth of the second epitaxial growth layers 1201b. For example, the first flow rate fr1 of the first precursor may be tuned to a third flow rate fr3. According to some embodiments, the third flow rate fr3 may be less than the first flow rate fr1. Furthermore, the second flow rate fr2 of the second precursor may be tuned to a fourth flow rate fr4. In some embodiments, the fourth flow rate fr4 may be greater than the second flow rate fr2. A second flow rate ratio R2 may be calculated as a ratio of the fourth flow rate fr4 to the third flow rate fr3 (e.g., R2=fr4/fr3). In some embodiments, the second flow rate ratio R2 is greater than the first flow rate ratio R1. As such, the percentage by volume germanium (Ge %) may increase from the first percentage by volume germanium (Ge %1) to the second percentage by volume germanium (Ge %2) during the growth of the second epitaxial growth layer 1201b.

In such embodiments, the second concentration ratio (Ge %2) of the second epitaxial growth layers 1201b may also be greater than or equal to the greatest level of concentration of the first concentration ratio (Ge % $1_{max}$) of the first epitaxial growth layers 1201a. Due to the difference in concentration levels of germanium between the second concentration ratio (Ge %2) and the first concentration ratio (Ge %1), first interfaces are formed between the first epitaxial growth layers 1201a and the second epitaxial growth layers 1201b. In embodiments in which the second concentration ratio (Ge %2) at the first interfaces is about the same as the first concentration ratio (Ge %1), the first interfaces may be considered to be continuous interfaces. For example, the first concentration ratio (Ge %1) may be a first concentration gradient of a first range of concentrations by volume where 0%≤Ge %1<25% and the second concentration ratio (Ge %2) may be a second concentration gradient of a second range of concentrations by volume where 25%≤Ge %2<50%. However, any suitable ranges of concentrations may be used for the first range and the second range.

Furthermore, in embodiments in which the second concentration ratio (Ge %2) represents a second gradient of concentration levels at the first interfaces and is different from the first concentration ratio (Ge %1) which represents a first gradient of concentration levels, the first interfaces may be considered to be discontinuous interfaces. For example, the first concentration ratio (Ge %1) may be a first concentration gradient of a first range of concentrations by volume where 0%≤Ge %1<20% and the second concentration ratio (Ge %2) may be a second concentration gradient of a second range of concentrations by volume where 30%≤Ge %2<50%. However, any suitable ranges of concentrations may be used for the first range and the second range. As a further example of discontinuous interfaces, the first concentration ratio (Ge %1) may be a first constant concentration level where 0%≤Ge %1<50% (e.g., Ge %1=25%) and the second concentration ratio (Ge %2) may be a second constant concentration level where 0%≤Ge %2<50% (e.g., Ge %2=40%). However, any suitable concentration levels may be used for the first constant concentration level and the second constant concentration level. According to some embodiments, a ratio of concentration level of the first interface may be maximum level of the second concentration level of germanium (Ge $\%2_{max}$) to the maximum level of the first concentration level of germanium (Ge $\%1_{max}$) which may be expressed as Ge $\%2_{max}$/Ge $\%1_{max}$ may be between about 1:1 and about 2.5:1. However, any suitable ratio may be used.

Furthermore, the second epitaxial growth layers 1201b may be doped with the p-type dopant (e.g., boron (B)) in situ during growth or implanted after growth. In embodiments in which the second epitaxial growth layers 1201b are doped in situ during growth, the control unit 1121 maintains the flow rate of the third precursor at the third flow rate (if that is the case) or the control unit 1121 directs the flow controller 1117 of the third precursor delivery system 1111 to deliver the third precursor to the deposition chamber 1113 at the third rate of between about 10 sccm and about 200 sccm. In embodiments in which dopants are implanted in the second epitaxial growth layers 1201b after growth, the flow rate of the third precursor may remain off (if it is the case) or may be shut off to discontinue doping in situ during growth. After the second epitaxial growth layers 1201b have been formed, the p-type dopants may be implanted using a process such as ion implantation.

Further still, in the illustrated embodiment, the second epitaxial growth layers 1201b are formed with second diamond shapes having second faceted surfaces with top surfaces being flat. The shapes and surfaces of the second epitaxial growth layers 1201b are controlled during growth by tuning the flow rate of the etching precursor. Furthermore, the second epitaxial growth layers 1201b are formed separated from one another, according to some embodiments. In other embodiments, the second epitaxial growth layers 1201b may be formed merged together.

The second epitaxial growth layers 1201b may be formed with the second concentration ratio (Ge %2) using the second flow ratio R2, in accordance with some embodiments. However, any suitable flow ratio may be used. Furthermore, the second epitaxial growth layers 1201b may be formed to a second height H2 over the first epitaxial growth layers 1201a using a second timed deposition process for a time period of between about 5 seconds and about 100 seconds, in accordance with some embodiments. However, any suitable time period may be used. According to some embodiments, the second height H2 is between about 1 nm and about 30 nm. However, any suitable height may be used. The second epitaxial growth layers 1201b may be referred to herein as second layers, middle layers, intervening layers, second source/drain layers, middle source/drain layers, intervening source/drain layers, or the like.

FIG. 12C illustrates a magnified view (not to scale) of the multilayer source/drain regions 1201 of the adjacent source/drain regions at one possible completion of the formation of the source/drain regions 1201. FIG. 12C further illustrates the formation of third epitaxial growth layers 1201C over the second epitaxial growth layers 1201b, according to some embodiments. The third epitaxial growth layers 1201C are formed with a third concentration ratio (Ge %3) of a relatively high concentration of germanium to a concentration of silicon or even pure germanium, in accordance with some embodiments. A high percentage concentration of germanium (Ge %) may be in a range of concentrations by volume where 50%≤Ge %<100%. In such embodiments, the third concentration ratio (Ge %3) of the third epitaxial growth layers 1201C are greater than the second concentration ratio (Ge %2) of the second epitaxial growth layers 1201b and the first concentration ratio (Ge %1) of the first epitaxial growth layers 1201a. The third epitaxial growth layers 1201c may be grown with the third concentration ratio (Ge %3) by tuning the flow rates of the first precursor and the second precursor during growth. For example, the third flow rate fr3 of the first precursor may be tuned to a fifth flow rate fr5. According to some embodiments, the fifth flow rate fr5 may be less than the third flow rate fr3. Furthermore, the fourth flow rate fr4 of the second precursor may be tuned to a sixth flow rate fr6. In some embodiments, the sixth flow rate fr6 may be greater than the fourth flow rate fr4. A third flow rate ratio R3 may be calculated as a ratio of the sixth flow rate fr6 to the fifth flow rate fr5 (e.g., R3=fr6/fr5). In some embodiments, the third flow rate ratio R3 is greater than the second flow rate ratio R2. As such, during the growth of the third epitaxial growth layers 1201C, the percentage by volume germanium (Ge %) may increase from the second percentage by volume germanium (Ge %2) to the third percentage by volume germanium (Ge %3). The second epitaxial growth layers 1201b prevent the third epitaxial growth layers 1201c strain relaxation due to a high lattice mismatch between the first epitaxial growth layers 1201a and the third epitaxial growth layers 1201c. Furthermore, the third epitaxial growth layers 1201c provide a low contact resistance between the multilayer source/drain regions 1201 and subsequently formed metal contacts.

Furthermore, the third epitaxial growth layers 1201c may be doped with the p-type dopant (e.g., boron (B)) in situ during growth or implanted after growth. In embodiments in which the third epitaxial growth layers 1201c are doped in situ during growth, the control unit 1121 maintains the flow rate of the third precursor at the third flow rate (if that is the case) or the control unit 1121 directs the flow controller 1117 of the third precursor delivery system 1111 to deliver the third precursor to the deposition chamber 1113 at the third rate of between about 10 sccm and about 200 sccm. In embodiments in which dopants are implanted in the third epitaxial growth layers 1201c after growth, the flow rate of the third precursor may remain off (if it is the case) or may be shut off to discontinue doping in situ during growth. After the third epitaxial growth layers 1201c have been formed, the p-type dopants may be implanted using a process such as ion implantation.

Further still, in the illustrated embodiment, the third epitaxial growth layers 1201c are formed with third diamond shapes having third faceted surfaces with top surfaces being flat. The shapes and surfaces of the third epitaxial growth layers 1201c are controlled during growth by tuning the flow rate of the etching precursor. Furthermore, the third epitaxial growth layers 1201c are formed together, according to some embodiments. In other embodiments, the third epitaxial growth layers 1201c may be formed separated from one another.

The third epitaxial growth layers 1201c may be formed to a third height H3 over the second epitaxial growth layers 1201b using a third timed deposition process for a time period of between about 5 seconds and about 100 seconds, in accordance with some embodiments. However, any suitable time period may be used. According to some embodiments, the third height H3 is between about 1 nm and about 40 nm. However, any suitable height may be used. Furthermore, the third epitaxial growth layers 1201c may be formed with the third concentration ratio (Ge %3) using the third flow ratio R3, in accordance with some embodiments. However, any suitable flow ratio may be used. The third epitaxial growth layers 1201c may be referred to herein as third layers, top layers, third source/drain layers, top source/drain layers, or the like.

FIG. 12C further illustrates the multilayer source/drain regions 1201 of adjacent source/drain regions, in accordance with some embodiments, in which the third epitaxial growth layers 1201c of the adjacent source/drain regions have merged. In some embodiments, the gate spacers 901 are used to separate the multilayer source/drain regions 1201 from the dummy gates 803 (shown in FIG. 10B) by an appropriate lateral distance so that the multilayer source/drain regions 1201 do not short out subsequently formed gates of the resulting FinFETs. Furthermore, materials of the multilayer source/drain regions 1201 may be selected to exert stress in the respective ones of the channel regions 805 (shown in FIG. 10B), thereby improving performance.

As a result of the epitaxy processes used to form the multilayer source/drain regions 1201 in the p-type region 200P, upper surfaces of the epitaxial source/drain regions have facets which expand laterally outward beyond sidewalls of the fins 103. In some embodiments, these facets cause adjacent ones of the source/drain regions 1201 of a same FinFET to merge as illustrated by FIG. 12C. In the embodiments illustrated in FIGS. 12A to 12C, gate spacers 901 are formed covering a portion of the sidewalls of the fins 103 that extend above the STI regions 105 thereby blocking the epitaxial growth. In some other embodiments, the spacer etch used to form the gate spacers 901 may be adjusted to remove the spacer material to allow the epitaxially grown region to extend to the surface of the STI regions 105.

Although the illustrated embodiment in FIGS. 12A-12C has the third epitaxial growth layers 1201c merged into one another and the remaining epitaxial growth layers of the adjacent multilayer source/drain regions 1201 remain separated, other embodiments are also possible. For example, in some embodiments the third epitaxial growth layers 1201c and the second epitaxial growth layers 1201b of the adjacent multilayer source/drain regions 1201 may be merged together and the first epitaxial growth layers 1201a of the adjacent multilayer source/drain regions 1201 may remain separate. Furthermore, in some embodiments the third epitaxial growth layers 1201c, the second epitaxial growth layers 1201b, and the first epitaxial growth layers 1201a of the adjacent multilayer source/drain regions 1201 may be merged together. All such examples of merged epitaxial growth layers of adjacent multilayer source/drain regions 1201 are within the scope of the embodiments.

Once the multilayer source/drain regions 1201 have been formed in the p-type region 200P, the epitaxial source/drain regions may be formed in the n-type region 200N by initially removing the mask from the n-type region 200N and placing another mask over the p-type region 200P. Once the mask in the n-type region 200N has been removed, source/drain regions may be epitaxially grown using any acceptable material, such as appropriate for n-type FinFETs. For example, if the fin 103 is silicon, the source/drain regions formed in the n-type region 200N may comprise materials exerting a tensile strain in the channel region 805, such as silicon, silicon carbide, phosphorous doped silicon carbide, silicon phosphide, or the like. Furthermore, the source/drain regions and/or the fins 103 in the n-type regions 200N may be implanted with n-type dopants to form n-type source/drain regions, similar to the process previously discussed for implanting dopants in the multilayer source/drain regions 1201 of the p-type region 200P, followed by an anneal. The source/drain regions in the n-type regions 200N may have an impurity concentration of between about $10^{19}$ cm$^{-3}$ and about $10^{21}$ cm$^{-3}$. According to some embodiments, the source/drain regions of the n-type region 200N may be epitaxially grown with a single concentration level of the materials throughout the source/drain regions. In other embodiments, the source/drain regions of the n-type region may be grown with a concentration level gradient of the materials in the source/drain regions. In other embodiments, the source/drain regions of the n-type region 200N may also be formed as multilayer source/drain regions that are similar to the multilayer source/drain regions 1201 of the p-type region 200P except having different concentration levels of carbon and/or phosphate in each of the layers instead of different concentration levels of germanium. Once the source/drain regions in the n-type regions 200N have been formed, the mask may be removed from the p-type regions 200P for further processing.

According to some embodiments, a first multilayer concentration ratio of the multilayer source/drain regions 1201 may be a ratio of a combined height of the layers with the highest concentration ratios (e.g., Ge %3) to a combined height of the layers with the lowest concentration ratios (e.g., Ge %1). According to some embodiments, the first multilayer concentration ratio (H3/H1) is between about 0.1:1 and about 3:1. As such, a first shared contact landing region 1203 is formed with a relatively large volume of material having the highest concentration ratios (e.g., Ge %3). The first shared contact landing region 1203 and other shared contact landing regions described herein may be collectively referred to herein as MD landings, contact landing regions, contact landing areas, contact landings, or the like.

The first shared contact landing region 1203 comprises a very deep extension area of the high concentration germanium (Ge %3) material that is formed between the second epitaxial growth layers 1201*b*. The boundaries of the first shared contact landing region 1203 are highlighted by a dashed line in FIG. 12D. The first shared contact landing region 1203 contains the volume of the high concentration of germanium (Ge %3) under the flat tops of the merged third layers 1201C down to and including the volume between the sidewalls of the second epitaxial growth layers 1201*b*. The first shared contact landing region 1203 extends to a first depth D1 along a centerline between the third epitaxial growth layers 1201C from a top of the third epitaxial growth layers 1201C to a bottom of the third epitaxial growth layers 1201C. According to some embodiments, the first depth D1 is between about 10 nm and about 50 nm. However, any suitable depth may be used. Furthermore, the first shared contact landing region 1203 has a first width W1 between tops of the second epitaxial growth layers 1201*b*. According to some embodiments, the first width W1 is between about 15 nm and about 30 nm. However, any suitable width may be used. The first shared contact landing region 1203 also has a second width W2 that is a minimum distance between the second epitaxial growth layers 1201*b*. According to some embodiments, the second width W2 is between about 0 nm and about 30 nm. However, any suitable width may be used. As such, the embodiment of the first shared contact landing region 1203 provides a high volume landing region with a very deep extension region having a low contact resistance for the eventual formation of the source/drain contact 1803 (illustrated in FIG. 18B).

In some embodiments, the third concentration ratio (Ge %3) may be a constant concentration level of germanium (Ge) throughout the structure of the third epitaxial growth layers 1201*c*. In other embodiments, the third concentration ratio (Ge %3) may be a gradient of concentration levels of germanium (Ge) that increases as a distance from the fins 103 increases. In such embodiments, the third concentration level of germanium (Ge %3) may be modified by tuning one or more of the flow rates of the first precursor and the second precursor to increase the percentage concentration of germanium during the growth of the third epitaxial growth layers 1201*c*. In some of such embodiments, the increase in percentage concentration of the germanium may be linear throughout the epitaxial growth. For example as indicated by the first directional arrow 1205*a* of FIG. 12C, the third concentration level of germanium (Ge %3) increases linearly from a minimum concentration level (e.g., Ge $\%_{min}$) to a maximum concentration level (e.g., Ge $\%_{max}$) as the distance from the fins 103 increases. In others of such embodiments, the increase in percentage concentration of the germanium may be non-linear throughout the epitaxial growth. For example, as indicated by the second directional arrow 12*o*5*b* of FIG. 12D, the third concentration level of germanium (Ge %3) increases from a first minimum concentration level (e.g., Ge $\%_{min1}$) to a maximum concentration level (e.g., Ge $\%_{max}$) as the distance from the fins 103 increases and then the third concentration level of germanium (Ge %3) decreases from the maximum to a second minimum concentration level (e.g., Ge $\%_{min2}$) as the distance from the fins 103 continues to increase. As such, the maximum concentration level (e.g., Ge $\%_{max}$) is located at a midpoint along the first distance D1.

In such embodiments, the third concentration ratio (Ge %3) of the third epitaxial growth layers 1201*c* is greater than or equal to the maximum level of concentration of the second ratio (Ge $\%2_{max}$) of the second epitaxial growth layers 1201*b*. Due to the difference in concentration levels of germanium between the third concentration ratio (Ge %3) and the second concentration ratio (Ge %2), second interfaces are formed between the second epitaxial growth layers 1201*b* and the third epitaxial growth layers 1201*c*. The range of concentration levels from the second concentration ratio (Ge %2) to the third concentration ratio (Ge %3) across the second interfaces may be continuous ranges or discontinuous ranges.

Furthermore, a second ratio between concentration levels at the second interface may be a maximum level of the third concentration level of germanium (Ge $\%3_{max}$) to the maximum level of the second concentration level of germanium (Ge $\%2_{max}$) which may be expressed as Ge $\%3_{max}$/Ge $\%2_{max}$) and may be between about 1:1 and about 2:1. However, any suitable ratio may be used.

Although the multilayer source/drain regions 1201 have been illustrated using three layers, the multilayer source/drain regions 1201 may have any suitable number of layers having low concentrations and/or any suitable number of layers having high concentrations. For example, in some embodiments, the multilayer source/drain regions 1201 may have one low concentration layer and one high concentration layer. In some embodiments, the multilayer source/drain regions 1201 may have more than one (e.g., two, three, or more) low concentration layers. In some embodiments, the multilayer source/drain regions 1201 may have more than one (e.g., two, three, or more) high concentration layers. All such combinations of low concentration layers and high concentration layers are within the scope of the embodiments. FIG. 12C further illustrates a third directional arrow 1205*c* that represents a direction of depth through the epitaxial growth of the third epitaxial growth layers 1201*c* and will be referenced in the discussion of FIG. 12D.

Figure 12D:
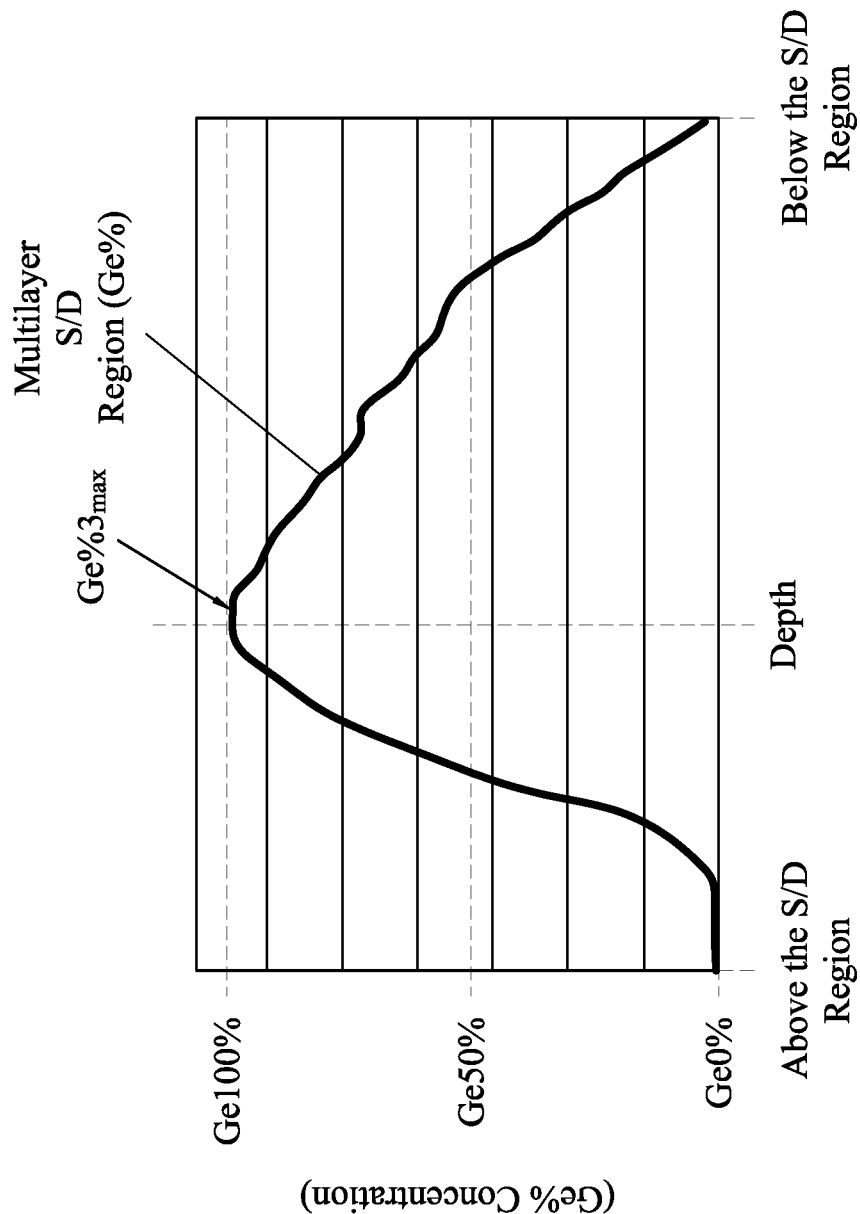
FIG. 12D is a graph illustrating concentration gradients of germanium as a function of depth through source/drain regions of FinFETs, in accordance with some embodiments.

Continuing to FIG. 12D, this figure is a graph of a line plotting concentration percentages of germanium (Ge %) as a function of depth along the third directional arrow 1205*c* (e.g., EDX at P-FET I/O region) through the multilayer source/drain region 1201 of FIG. 12C, according to some embodiments. The line represents the concentration of germanium (Ge %) of the multilayer source/drain region 1201 for an embodiment in which the concentration of germanium is a gradient along the third directional arrow 1205*c*. The graph further illustrates that percentage concentration of germanium (Ge %) of the source/drain regions 1201 ranges from a minimum percentage concentration of germanium of about 0% (Geo %) to a maximum percentage concentration of germanium (Ge $\%3_{max}$) of about 100% germanium, according to some embodiments. The graph further illustrates that the gradient along the third directional arrow 1205*c* starting above the multilayer source/drain region 1201 increases at a first rate from its minimum percentage (Geo %) to its maximum percentage (Ge $\%3_{max}$) as the depth increases to a midpoint along the third directional arrow 1205*c*. The graph further shows that the gradient along the third directional arrow 1205*c* decreases at a second rate from its maximum percentage (Ge $\%3_{max}$) to its minimum percentage (Geo %) as the depth continues to increase from the midpoint along the third directional arrow 1205*c* to a point below the multilayer source/drain regions 1201.

Figure 13B:
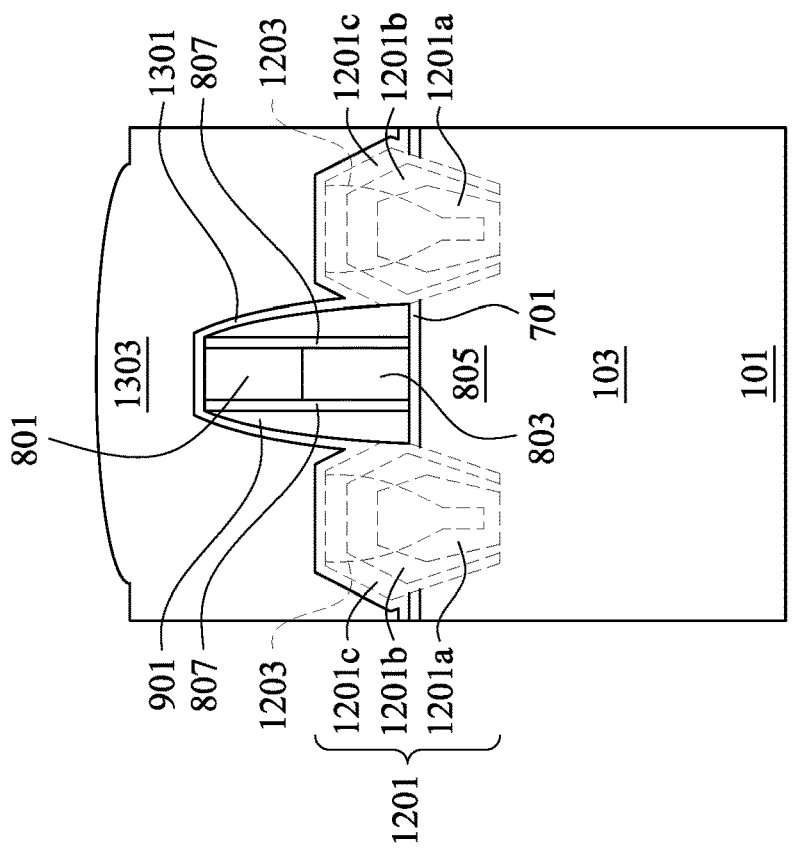
Figure 13A:
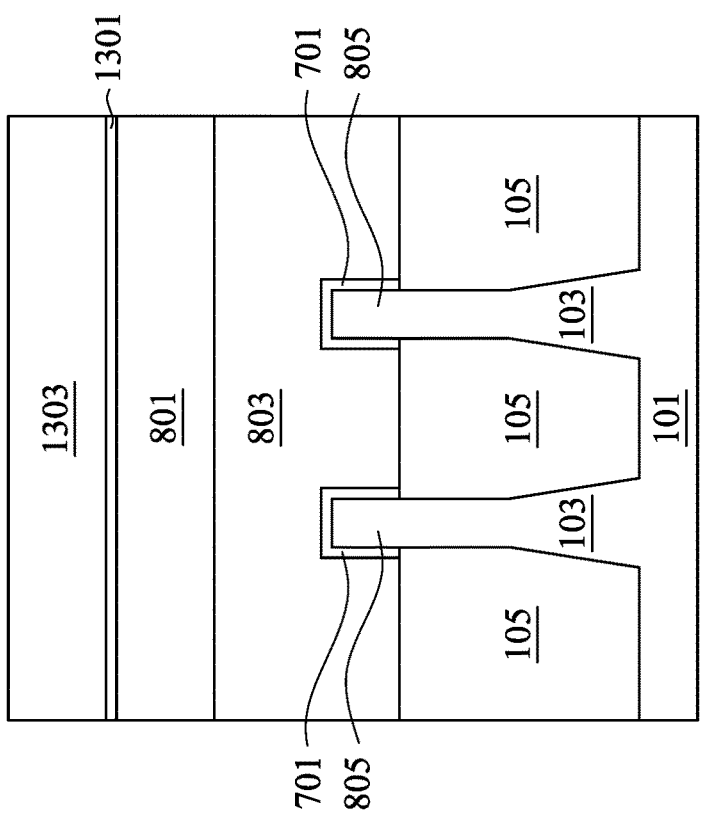

FIGS. 13A and 13B illustrate the formation of a contact etch stop layer (CESL) 1301 and a first interlayer dielectric (ILD) 1303 with respect to the cut lines A-A and B-B respectively, in accordance with some embodiments. Once the multilayer source/drain regions 1201 have been formed in the first openings 1001, the contact etch stop layer 1301 and the first interlayer dielectric 1303 may be formed. In some embodiments, the contact etch stop layer 1301 is formed over exposed surfaces of the multilayer source/drain regions 1201, the dummy dielectric layer 701, the gate spacers 901, the gate seal spacers 807, and the masks 801. The contact etch stop layer 1301 may comprise a dielectric material, such as, silicon nitride, silicon oxide, silicon oxynitride, or the like. However, any suitable dielectric material may be used.

Once the contact etch stop layer 1301 has been formed, the first interlayer dielectric 1303 is deposited over the contact etch stop layer 1301. The first interlayer dielectric 1303 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may also be used. According to some embodiments, the dielectric material of the contact etch stop layer 1301 has a lower etch rate than the dielectric material of the first interlayer dielectric 1303.

FIG. 13B further illustrates the first shared contact landing region 1203 in each of the multilayer source/drain regions 1201. The first shared contact landing region 1203 are illustrated in phantom view to indicate they are behind the surface of the cutline B-B shown in FIG. 13B. The profile of the first shared contact landing region 1203 illustrated with respect to the cutline B-B is similar to the profile of the first shared contact landing region 1203 illustrated in FIG. 12D with respect to the cutline C-C, although they may also be different.

Figure 14B:
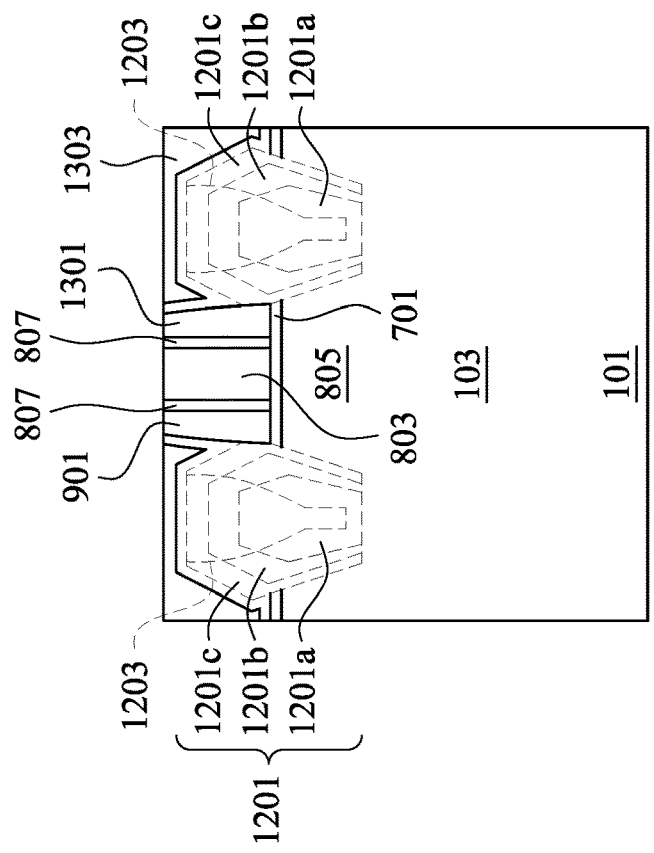
Figure 14A:
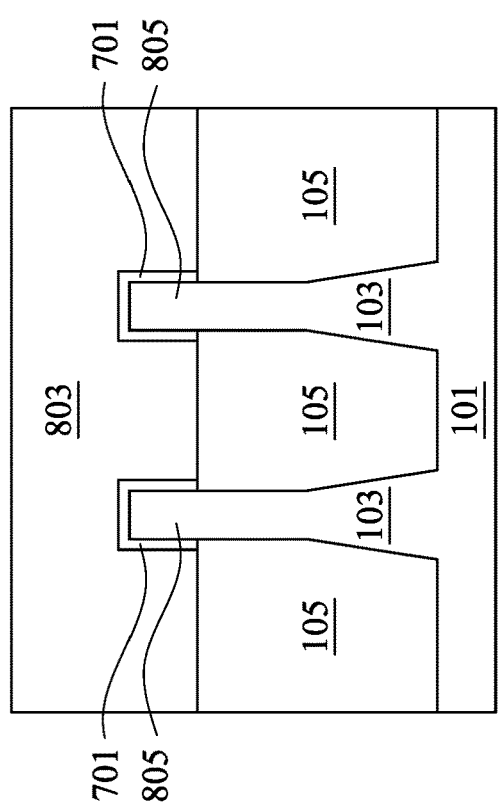

In FIGS. 14A and 14B, a planarization process, such as a CMP, may be performed to level the top surface of the first interlayer dielectric 1303 with the top surfaces of the dummy gates 803 or the masks 801. The planarization process may also remove the masks 801 on the dummy gates 803, and portions of the gate seal spacers 807 and the gate spacers 901 along sidewalls of the masks 801. After the planarization process, top surfaces of the dummy gates 803, the gate seal spacers 807, the gate spacers 901, and the first interlayer dielectric 1303 are level. Accordingly, the top surfaces of the dummy gates 803 are exposed through the first interlayer dielectric 1303. In some embodiments, the masks 801 may remain, in which case the planarization process levels the top surface of the first interlayer dielectric 1303 with the top surfaces of the masks 801.

In FIGS. 15A and 15B, the dummy gates 803, and the masks 801 if present, are removed in an etching step(s), so that second openings 1501 are formed. Portions of the dummy dielectric layer 701 in the second openings 1501 may also be removed. In some embodiments, only the dummy gates 803 are removed and the dummy dielectric layer 701 remains and is exposed by the second openings 1501. In some embodiments, the dummy dielectric layer 701 is removed from second openings 1501 in a first region of a die (e.g., a core logic region) and remains in second openings 1501 in a second region of the die (e.g., an input/output region). In some embodiments, the dummy gates 803 are removed by an anisotropic dry etch process. For example, the etching process may include a dry etch process using reaction gas(es) that selectively etch the dummy gates 803 with little or no etching of the first interlayer dielectric 1303 or the gate spacers 901. Each of the second openings 1501 exposes and/or overlies a channel region 805 of a respective one of the fins 103. Each channel region 805 is disposed between neighboring pairs of the multilayer source/drain regions 1201. During the removal, the dummy dielectric layer 701 may be used as an etch stop layer when the dummy gates 803 are etched. The dummy dielectric layer 701 may then be optionally removed after the removal of the dummy gates 803.

Figure 16B:
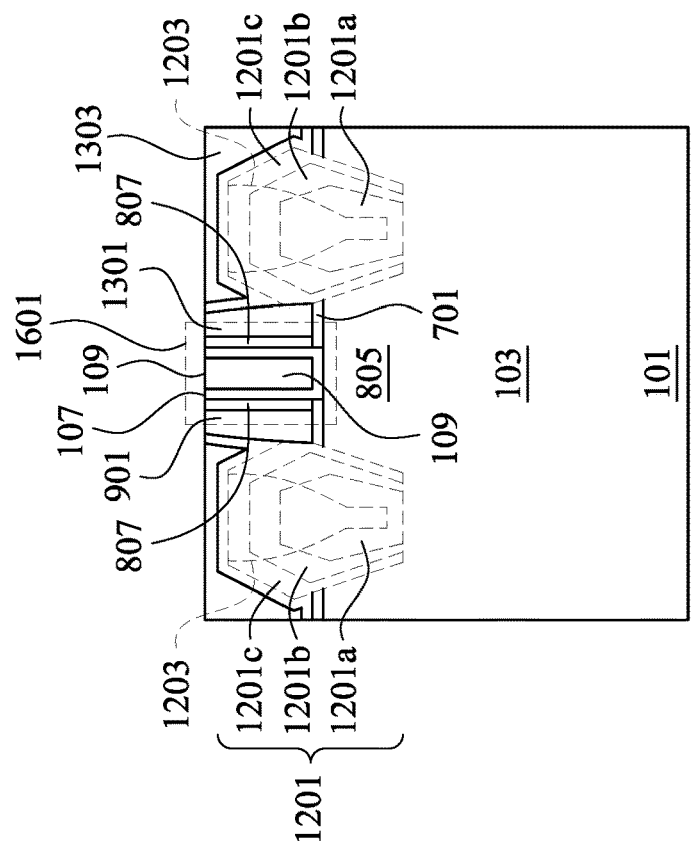
Figure 16A:
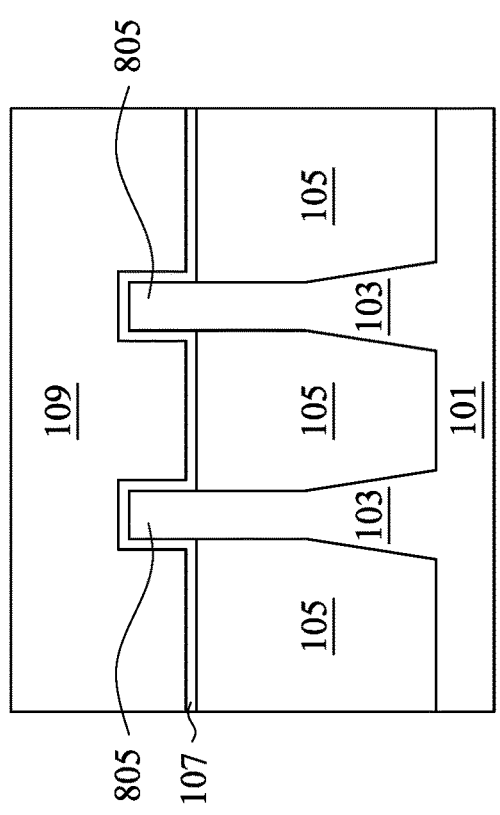
Figure 16C:
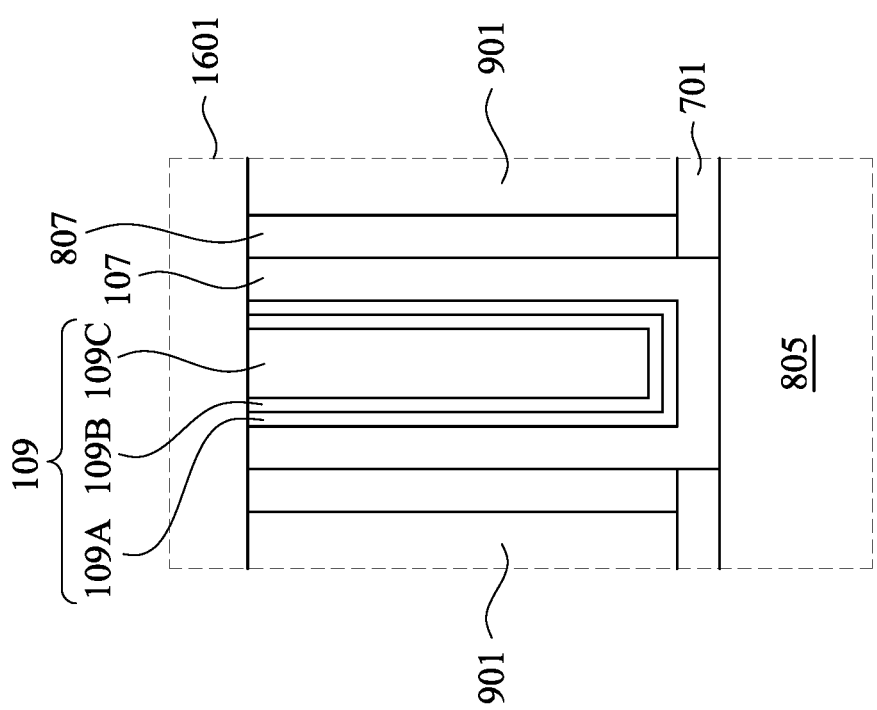

In FIGS. 16A and 16B, the gate dielectric layers 107 and the gate electrodes 109 are formed for replacement gates. FIG. 16C illustrates a detailed view of region 1601 of FIG. 16B. Gate dielectric layers 107 may be formed by one or more layers deposited in the second openings 1501, such as on the top surfaces and the sidewalls of the fins 103 and on sidewalls of the gate seal spacers 807 and/or gate spacers 901. The gate dielectric layers 107 may also be formed on the top surface of the first interlayer dielectric 1303. In some embodiments, the gate dielectric layers 107 comprise one or more dielectric layers, such as one or more layers of silicon oxide, silicon nitride, metal oxide, metal silicate, or the like. For example, in some embodiments, the gate dielectric layers 107 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 107 may include a dielectric layer having a k value greater than about 7.0. The formation methods of the gate dielectric layers 107 may include Molecular-Beam Deposition (MBD), ALD, PECVD, and the like. In embodiments where portions of the dummy dielectric layer 701 remains in the second openings 1501, the gate dielectric layers 107 include a material of the dummy dielectric layer 701 (e.g., $SiO_2$).

The gate electrodes 109 are deposited over the gate dielectric layers 107, respectively, and fill the remaining portions of the second openings 1501. The gate electrodes 109 may include a metal-containing material such as titanium nitride, titanium oxide, tantalum nitride, tantalum carbide, cobalt, ruthenium, aluminum, tungsten, combinations thereof, or multi-layers thereof. For example, although a single layer is illustrated for the gate electrode 109 in FIG. 16B, the gate electrode 109 may comprise any number of liner layers 109A, any number of work function tuning layers 109B, and a fill material 109C as illustrated by FIG. 16C. After the filling and/or overfilling of the second openings 1501, a planarization process, such as a CMP, may be performed to remove the excess portions of the gate dielectric layers 107 and the material of the gate electrodes 109 from top surface of the first interlayer dielectric 1303. The remaining portions of material of the gate electrodes 109 and the gate dielectric layers 107 thus form replacement gates of the resulting FinFETs. The gate electrodes 109 and the gate dielectric layers 107 may be collectively referred to as a "gate stack." The gate and the gate stacks may extend along sidewalls of the channel region 805 of the fins 103.

The formation of the gate dielectric layers 107 in the n-type region 200N and the p-type region 200P may occur simultaneously such that the gate dielectric layers 107 in each region are formed from the same materials, and the formation of the gate electrodes 109 may occur simultaneously such that the gate electrodes 109 in each region are formed from the same materials. In some embodiments, the gate dielectric layers 107 in each region may be formed by distinct processes, such that the gate dielectric layers 107 may be different materials, and/or the gate electrodes 109 in each region may be formed by distinct processes, such that the gate electrodes 109 may be different materials. Various masking steps may be used to mask and expose appropriate regions when using distinct processes.

In FIGS. 17A and 17B, a gate mask 1701 is formed over the gate stack (including a gate dielectric layer 107 and a gate electrode 109), and the gate mask 1701 may be disposed between opposing portions of the gate spacers 901. In some embodiments, forming the gate mask 1701 includes recessing the gate stack so that a recess is formed directly over the gate stack and between opposing portions of the gate spacers 901. A gate mask 1701 comprising one or more layers of dielectric material, such as silicon nitride, silicon oxynitride, or the like, is filled and/or overfilled in the recess, followed by a planarization process to remove excess portions of the dielectric material extending over the first interlayer dielectric 1303.

As also illustrated in FIGS. 17A and 17B, a second interlayer dielectric 1703 is deposited over the first interlayer dielectric 1303. In some embodiments, the second interlayer dielectric 1703 is a flowable film formed by a flowable CVD method. In some embodiments, the second interlayer dielectric 1703 is formed of a dielectric material such as PSG, BSG, BPSG, USG, or the like, and may be deposited by any suitable method, such as CVD and PECVD. The subsequently formed gate contacts 1801 (FIGS. 18A and 18B) penetrate through the second interlayer dielectric 1703 and the gate mask 1701 to contact the top surface of the recessed gate electrode 109.

Figures 18A, 18B:
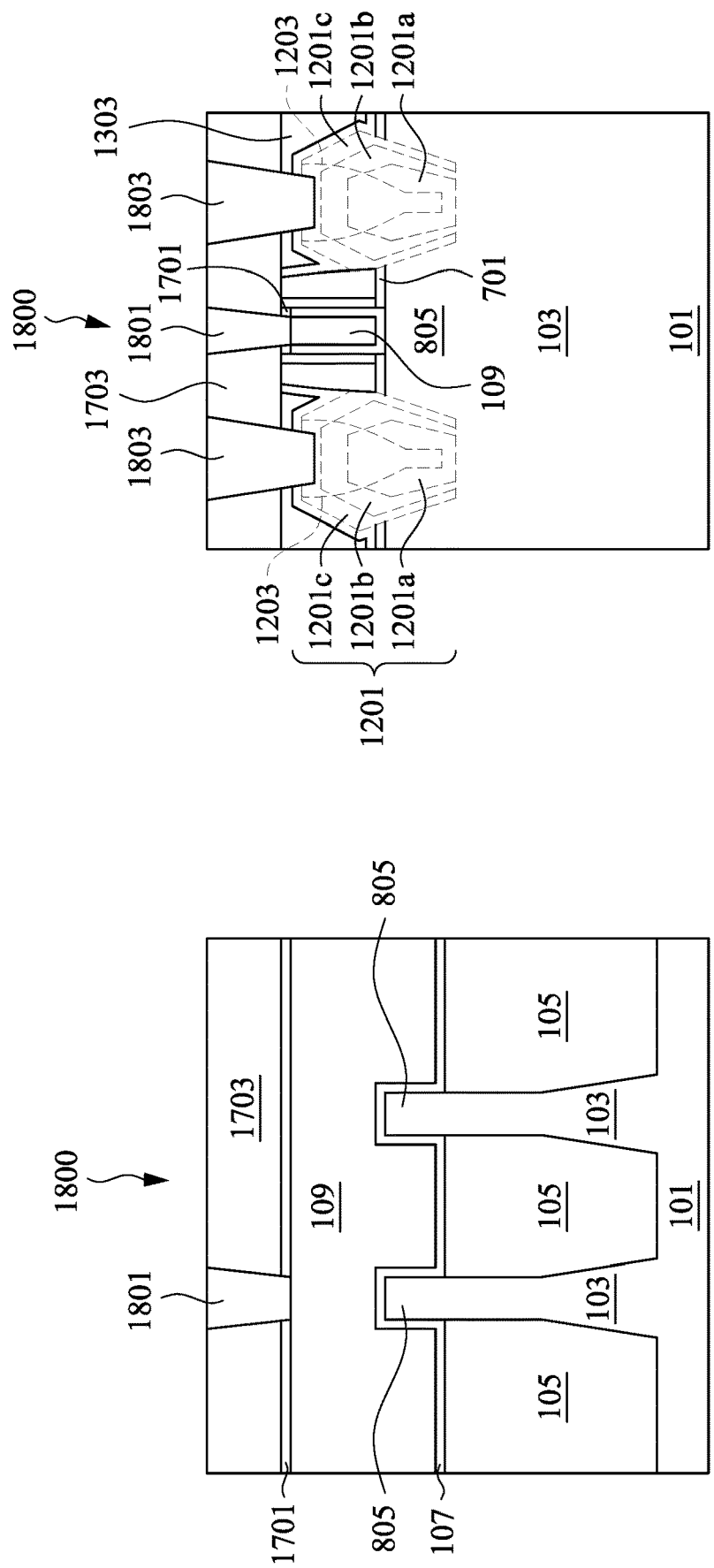

FIGS. 18A and 18B illustrate the formation of gate contacts 1801 and the source/drain contacts 1803 of a second FinFET 1800, according to some embodiments. The gate contacts 1801 and the source/drain contacts 1803 are formed by initially forming openings through one or more of the second interlayer dielectric 1703, the first interlayer dielectric 1303, the contact etch stop layer 1301, or the gate mask 1701.

In particular, openings for the source/drain contacts 1803 are formed through the second interlayer dielectric 1703, the first interlayer dielectric 1303, the contact etch stop layer 1301 and into the first shared contact landing region 1203 of the multilayer source/drain regions 1201. The openings for the source/drain contacts 1803 may be formed using acceptable photolithography and etching techniques.

Furthermore, openings for the gate contacts 1801 may be formed in combination with or in addition to the openings for the source/drain contacts 1803. The openings for the gate contacts 1801 are formed through the second interlayer dielectric 1703, the gate mask 1701, and into the materials of the gate electrode 109. The openings for the gate contacts 1801 may be formed using acceptable photolithography and etching techniques.

Once openings have been formed for the source/drain contacts 1803 and/or the gate contacts 1801, a liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second interlayer dielectric 1703. The remaining liner and conductive material form the source/drain contacts 1803 and/or the gate contacts 1801 in their respective openings. An anneal process may be performed to form a silicide at the interface between the multilayer source/drain regions 1201 and the source/drain contacts 1803. The source/drain contacts 1803 are physically and electrically coupled to the first shared contact landing region 1203 of the multilayer source/drain regions 1201, and the gate contacts 1801 are physically and electrically coupled to the gate electrodes 109 and provide external connections to the second FinFET 1800. The source/drain contacts 1803 and gate contacts 1801 may be formed in different processes, or may be formed in the same process. Although shown as being formed in the same cross-sections, it should be appreciated that each of the source/drain contacts 1803 and gate contacts 1801 may be formed in different cross-sections, which may avoid shorting of the contacts.

Although embodiments of the multilayer source/drain regions 1201 have been discussed with the diamond shapes and/or surfaces of the layers being similar shapes to one another from one layer to another, the layers of the multilayer source/drain regions 1201 may have any suitable shapes and/or surfaces from one layer to another layer. The layers of the multilayer source/drain regions 1201 may be grown having surfaces raised from respective surfaces of the fins 103 with shapes such as square shapes, diamond shapes, round shapes, or the like. In some embodiments, the layers of the multilayer source/drain regions 1201 may have smooth surfaces, facet-limited surfaces, or the like. For example, one layer of the multilayer source/drain regions 1201 may be square shaped having flat surfaces and another layer may be diamond shaped having faceted surfaces. Any of the layers of the multilayer source/drain regions 1201 may be any of the acceptable shapes and acceptable surfaces, any of the layers may be differently shaped and/or have different surfaces from any of the other layers. All such shapes and surfaces of the multilayer source/drain regions 1201 and all such combinations of shapes and surfaces of the layers are within the scope of the embodiments.

With reference now to FIGS. 19 to 24, these figures are illustrated along reference cross-section C-C illustrated in FIG. 1, except for multiple fins/FinFETs. Furthermore, FIGS. 19 to 24 are similar to FIG. 12D and illustrate intermediate steps in forming the multilayer source/drain regions 1201 according to further embodiments.

Figure 19:
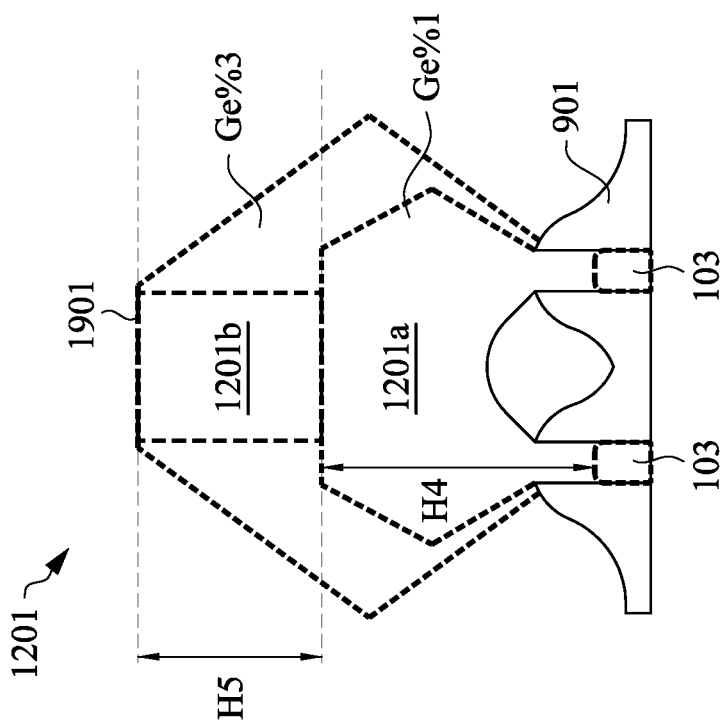

Turning to FIG. 19, this figure illustrates a magnified view (not to scale) of the multilayer source/drain regions 1201 of the adjacent source/drain regions, in accordance with another embodiment. The embodiment illustrated in FIG. 19 is similar to the embodiment illustrated in FIG. 12D; however, the multilayer source/drain region 1201 illustrated in FIG. 19 comprises two layers instead of three. FIG. 19 further illustrates that the first epitaxial growth layers 1201a of the adjacent source/drain regions are formed with the first concentration ratio (Ge %1) of the relatively low concentration of germanium, where 0%≤Ge %1<50% and the second epitaxial growth layers 1201b are formed to fill up the top volume of the multilayer source/drain region 1201 with the third concentration ratio (Ge %3) of the relatively high concentration of germanium, where 50%≤Ge %3 100%. As such, a third interface is formed between the first epitaxial growth layers 1201a with the first concentration ratio (Ge %1) and the second epitaxial growth layers 1201b with the third concentration ratio (Ge %3). According to some embodiments, a third ratio of concentration level of the third interface may be a maximum level of the third concentration level of germanium (Ge $\%3_{max}$) to the maximum level of the first concentration level of germanium (Ge $\%1_{max}$) which may be expressed as Ge $\%3_{max}$/Ge $\%1_{max}$) and may be between about 1:1 and about 4:1. However, any suitable ratio may be used. Furthermore, the concentration levels at the third interface may be continuous or discontinuous.

In the embodiment illustrated in FIG. 19, the first epitaxial growth layers 1201*a* are formed with diamond shapes, have flat tops, and are merged together instead of remaining separate. In some embodiments, the first epitaxial growth layers 1201*a* are formed using a fourth timed deposition process for a time period of between about 50 seconds and about 200 seconds. However, any suitable time period may be used. According to some embodiments, the first epitaxial growth layers 1201*a* are formed over the fins 103 to a fourth height H4 of between about 20 nm and about 50 nm. However, any suitable height may be used. In addition, the second epitaxial growth layers 1201*b* are also formed with diamond shapes and have flat tops. In some embodiments, the second epitaxial growth layers 1201*b* are formed using a fifth timed deposition process for a time period of between about 10 seconds and about 100 seconds. However, any suitable time period may be used. In some embodiments, the second epitaxial growth layers 1201*b* are formed over the first epitaxial growth layers 1201*a* to a fifth height H5 of between about 10 nm and about 30 nm. However, any suitable height may be used. As such, the multilayer source/drain regions 1201 of the illustrated embodiment have the second multilayer concentration ratio that can be a ratio of a combined height of the layers with the highest concentration ratios (e.g., Ge %3) to a combined height of the layers with the lowest concentration ratios (e.g., Ge %1). According to some embodiments, the fifth height H5 to fourth height H4 (H5/H4) is between about 0.1:1 and about 1.5:1. As such, the second shared contact landing region 1901 is formed with a relatively large volume of material having the highest concentration ratios (e.g., Ge %3).

FIG. 19 further illustrates a second shared contact landing region 1901 of the multilayer source/drain regions 1201, in accordance with some embodiments. The boundaries of the second shared contact landing region 1901 are highlighted by a dashed line in FIG. 19. The boundaries of the second shared contact landing region 1901 contains the volume of the high concentration of germanium (Ge %3) under the flat tops of the merged second layers 1201*b* down to the flat tops of the merged first layers 1201*a* of the low concentration of germanium (Ge %1). As such, the second shared contact landing region 1901 provides a high volume landing region having a low contact resistance for the eventual formation of the source/drain contact 1803.

Figure 20:
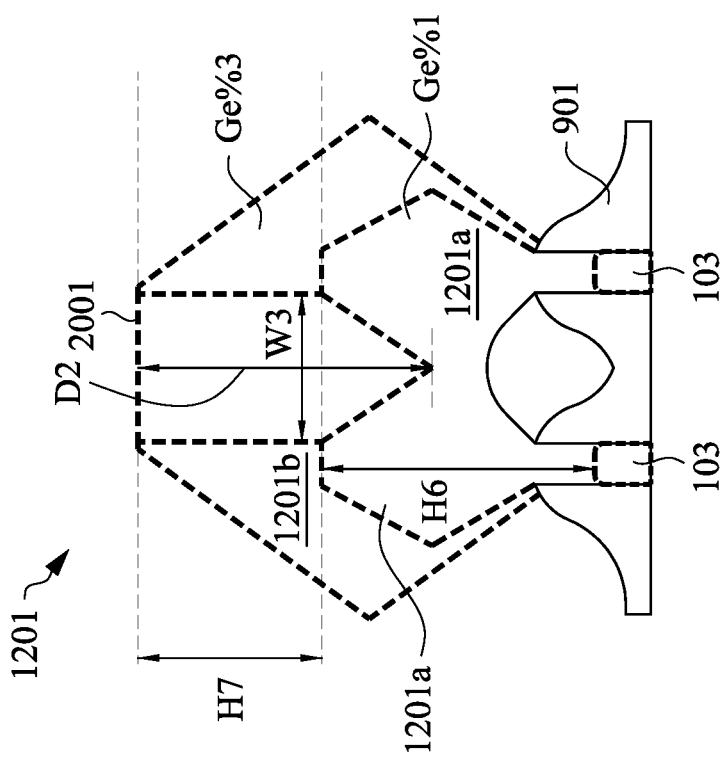
FIGS. 19, 20, 21, 22, 23, and 24 are cross-sectional views of other FinFETs, in accordance with some other embodiments.

FIG. 20 illustrates a magnified view (not to scale) of the multilayer source/drain regions 1201 of the adjacent source/drain regions, in accordance with still another embodiment. The embodiment illustrated in FIG. 20 is similar to the one illustrated in FIG. 19; however, the first epitaxial growth layers 1201*a* of the adjacent source/drain regions are only partially merged. As such, the embodiment of FIG. 20 comprises a third shared contact landing region 2001, according to still another embodiment.

In the illustrated embodiment of FIG. 20, the second epitaxial growth layers 1201*b* are formed with the third concentration ratio (Ge %3) and fill the top volume of the multilayer source/drain regions 1201 over the first layer 1201*a* which are formed with the first concentration ratio (Ge %1). According to some embodiments, the first epitaxial growth layers 1201*a* are formed using a sixth timed deposition process for a time period of between about 50 seconds and about 200 seconds. As such, the first epitaxial growth layers 1201*a* are formed over the fins 103 to a sixth height (H6). According to some embodiments, the first epitaxial growth layers 1201*a* are formed over the fins 103 to the sixth height H6 of between about 20 nm and about 50 nm. However, any suitable height may be used. However, any suitable time period and any suitable height may be used. Furthermore, the second epitaxial growth layers 1201*b* are formed using a seventh timed deposition process for a time period of between about 10 seconds and about 100 seconds, in accordance with some embodiments. Accordingly, the second epitaxial growth layers 1201*b* are formed over the first epitaxial growth layers 1201*a* to a seventh height (H7). In some embodiments, the second epitaxial growth layers 1201*b* are formed over the first epitaxial growth layers 1201*a* to the seventh height H7 of between about 10 nm and about 30 nm. However, any suitable time period and any suitable height may be used. As such, the multilayer source/drain region 1201 of the illustrated embodiment comprises the second multilayer concentration ratio (H7/H6) which is between about 0.1:1 and about 1.5:1. As such, the third shared contact landing region 2001 is formed with a relatively large volume of material having the highest concentration ratios (e.g., Ge %3).

The third shared contact landing region 2001 further comprises a deep extension area of high concentration germanium (Ge %3) material that is formed between non-merged portions of the first epitaxial growth layers 1201*a*. The boundaries of the third shared contact landing region 2001 are highlighted by a dashed line in FIG. 20. The third shared contact landing region 2001 contains the volume of the high concentration of germanium (Ge %3) under the flat tops of the merged second layers 1201*b* down to and including the volume between the sidewalls of the partially merged first layers 1201*a*. The third shared contact landing region 2001 extends to a second depth D2 over the partially merged first layers 1201*a*. According to some embodiments, the second depth D2 is between about 10 nm and about 50 nm. However, any suitable depth may be used. Furthermore, the third shared contact landing region 2001 has a third width W3 between tops of the first epitaxial growth layers 1201*a*. According to some embodiments, the third width W3 is between about 15 nm and about 30 nm. However, any suitable width may be used. As such, the embodiment of the third shared contact landing region 2001 provides a high volume landing region with a deep extension region having a low contact resistance for the eventual formation of the source/drain contact 1803.

Figure 21:
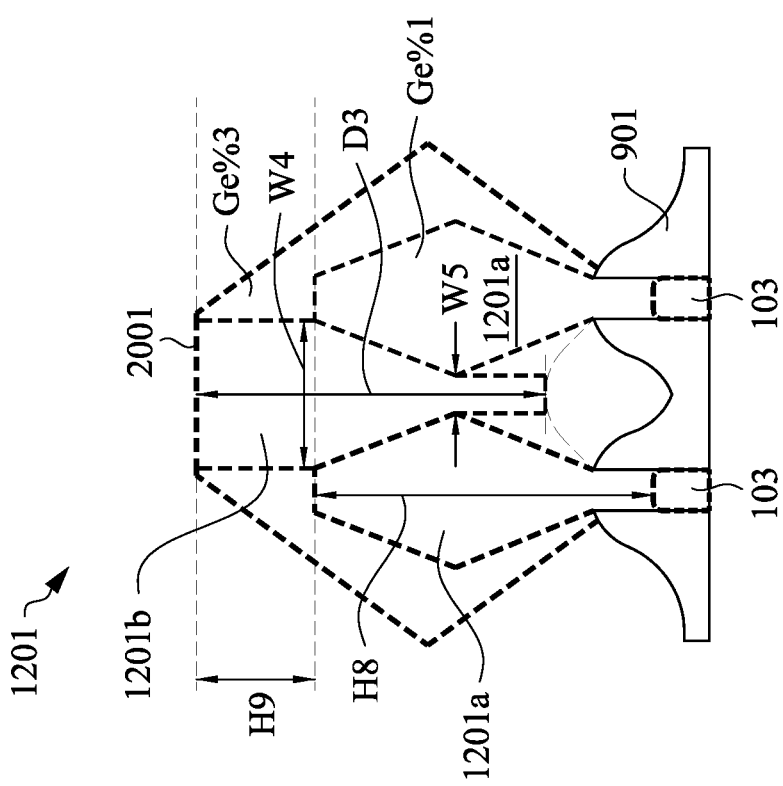

FIG. 21 is a magnified view (not to scale) of the multilayer source/drain regions 1201 of the adjacent source/drain regions, in accordance with yet another embodiment. The embodiment illustrated in FIG. 21 is similar to the one illustrated in FIG. 20; however, the first epitaxial growth layers 1201*a* of the adjacent source/drain regions are formed to an eighth height H8 and the first epitaxial growth layers 1201*a* remain separated. According to some embodiments, the first epitaxial growth layers 1201*a* are formed using an eighth timed deposition process for a time period of between about 50 seconds and about 100 seconds. As such, the first epitaxial growth layers 1201*a* are formed over the fins 103 to the eighth height (H8) that is between about 20 nm and about 50 nm. However, any suitable time period and height may be used. Furthermore, the second epitaxial growth layers 1201*b* are formed using a ninth timed deposition process for a time period of between about 30 seconds and about 100 seconds, in accordance with some embodiments. Accordingly, the second epitaxial growth layers 1201*b* of the adjacent source/drain regions are formed to a ninth height H9 over the first epitaxial growth layers 1201*a* and fill the top volume of the multilayer source/drain regions 1201.

According to some embodiments, the ninth height H9 is between about 10 nm and about 30 nm. However, any suitable time period and height may be used. As such, the multilayer source/drain region 1201 of the illustrated embodiment comprises a third multilayer concentration ratio (H9/H8) which is between about 0.1:1 and about 1.5:1. Furthermore, the multilayer source/drain regions 1201 in the illustrated embodiment comprises a fourth shared contact landing region 2101 that is formed with a relatively large volume of material having the highest concentration ratios (e.g., Ge %3) according to yet another embodiment.

The fourth shared contact landing region 2101 comprises a very deep extension area of the high concentration germanium (Ge %3) material that is formed between the first epitaxial growth layers 1201a. The boundaries of the fourth shared contact landing region 2101 are highlighted by a dashed line in FIG. 21. The fourth shared contact landing region 2101 contains the volume of the high concentration of germanium (Ge %3) under the flat tops of the merged second layers 1201b down to and including the volume between the sidewalls of the first epitaxial growth layers 1201a. The fourth shared contact landing region 2101 extends to a third depth D3 along a centerline between the first epitaxial growth layers 1201a to a bottom of the second epitaxial growth layers 1201b. According to some embodiments, the third depth D3 is between about 30 nm and about 50 nm. However, any suitable depth may be used. Furthermore, the fourth shared contact landing region 2101 has a fourth width W4 between tops of the first epitaxial growth layers 1201a. According to some embodiments, the fourth width W4 is between about 15 nm and about 30 nm. However, any suitable width may be used. In addition, the fourth shared contact landing region 2101 has a fifth width W5 that is a minimum distance between sidewalls of the first epitaxial growth layers 1201a. According to some embodiments, the fifth width W5 is between about 0 nm and about 30 nm. However, any suitable width may be used. As such, the embodiment of the fourth shared contact landing region 2101 provides a high volume landing region with a very deep extension region having a low contact resistance for the eventual formation of the source/drain contact 1803.

Figure 22:
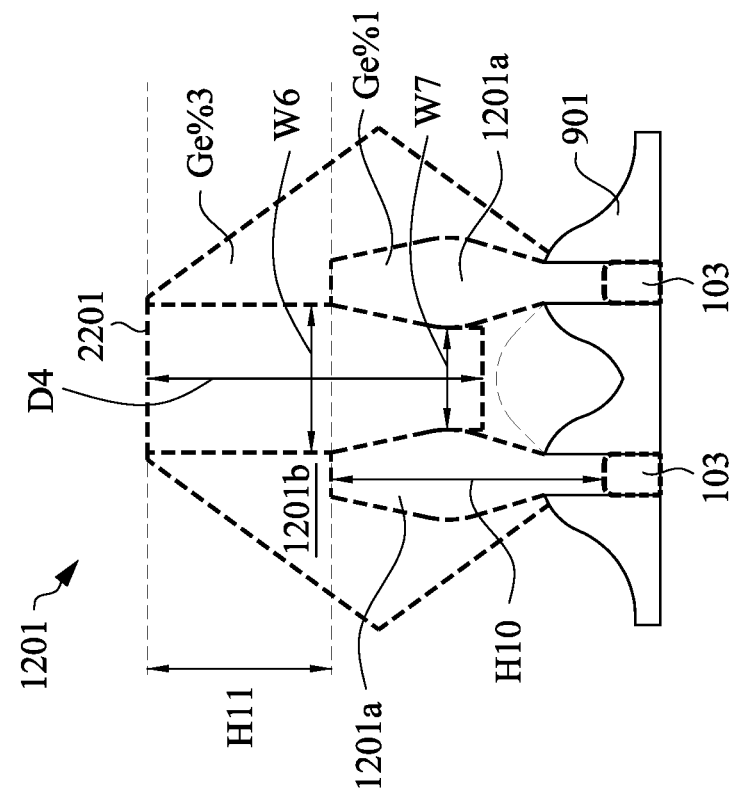

FIG. 22 is a magnified view (not to scale) of the multilayer source/drain regions 1201 of the adjacent source/drain regions, in accordance with another embodiment. The multilayer source/drain regions 1201 illustrated in FIG. 22 comprise the second epitaxial growth layers 1201b formed to an eleventh height H11 having the third concentration ratio (Ge %3) and are formed to fill the top volume of the multilayer source/drain regions 1201 over the first epitaxial growth layers 1201a formed to a tenth height H10 having the first concentration ratio (Ge %1). According to some embodiments, the first epitaxial growth layers 1201a are formed over the fins 103 to the tenth height H10 of between about 20 nm and about 50 nm. However, any suitable height may be used. In some embodiments, the second epitaxial growth layers 1201b are formed over the first epitaxial growth layers 1201a to the eleventh height H11 of between about 10 nm and about 30 nm. The embodiment illustrated in FIG. 22 is similar to the embodiment illustrated in FIG. 20; however, the first epitaxial growth layers 1201a remain separated and the first epitaxial growth layers 1201a are formed with rounded shapes instead of diamond shapes. The first epitaxial growth layers 1201a may be formed with the rounded shapes, according to some embodiments, by tuning the first precursor, the second precursor, and/or the etching precursor while using appropriate multi-cycle deposition and etching steps to shape the epitaxial growth during formation. According to some embodiments, the first epitaxial growth layers 1201a are formed using a tenth timed deposition process for a time period of between about 50 seconds and about 100 seconds. As such, the first epitaxial growth layers 1201a are formed over the fins 103 to the tenth height H10. However, any suitable time period and any suitable height may be used. Furthermore, the second epitaxial growth layers 1201b are formed using an eleventh timed deposition process for a time period of between about 30 seconds and about 100 seconds, in accordance with some embodiments. Accordingly, the second epitaxial growth layers 1201b are formed over the first epitaxial growth layers 1201a to the eleventh height H11. However, any suitable time period and any suitable height may be used. As such, the multilayer source/drain region 1201 of the illustrated embodiment comprises a third multilayer concentration ratio (H11/H10) which is between about 0.1:1 and about 1.5:1. Furthermore, the multilayer source/drain regions 1201 in the illustrated embodiment comprises a fourth shared contact landing region 2101 that is formed with a relatively large volume of material having the highest concentration ratios (e.g., Ge %3) according to yet another embodiment.

The multilayer source/drain regions 1201 of the embodiment illustrated in FIG. 22 comprise a fifth shared contact landing region 2201 of the high concentration germanium (Ge %3) material, according to another embodiment. The fifth shared contact landing region 2201 comprises a very deep and wide extension area of the high concentration germanium (Ge %3) material that is formed between the first epitaxial growth layers 1201a. The boundaries of the fifth shared contact landing region 2201 are highlighted by a dashed line in FIG. 22. The fifth shared contact landing region 2201 contains the volume of the high concentration of germanium (Ge %3) under the flat tops of the merged second layers 1201b down to and including the volume between the sidewalls of the first epitaxial growth layers 1201a. The fifth shared contact landing region 2201 extends to a fourth depth D4 along a centerline between the first epitaxial growth layers 1201a from the top of the second epitaxial growth layers 1201b to a bottom of the second epitaxial growth layers 1201b. According to some embodiments, the fourth depth D4 is between about 30 nm and about 50 nm. However, any suitable depth may be used. Due to the rounded shapes of the first epitaxial growth layers 1201a, the very deep extension area is also wide. According to some embodiments, the fifth shared contact landing region 2201 has a sixth width W6 between tops of the first epitaxial growth layers 1201a. According to some embodiments, the sixth width W6 is between about 15 nm and about 30 nm. However, any suitable width may be used. In addition, a minimum width between the first epitaxial growth layers 1201a is a seventh width W7 of between about 0 nm and about 30 nm. However, any suitable width may be used. As such, the embodiment of the fifth shared contact landing region 2201 provides a high volume landing region with a very deep and wide extension region that has a low contact resistance for the eventual formation of the source/drain contact 1803.

Figure 23:
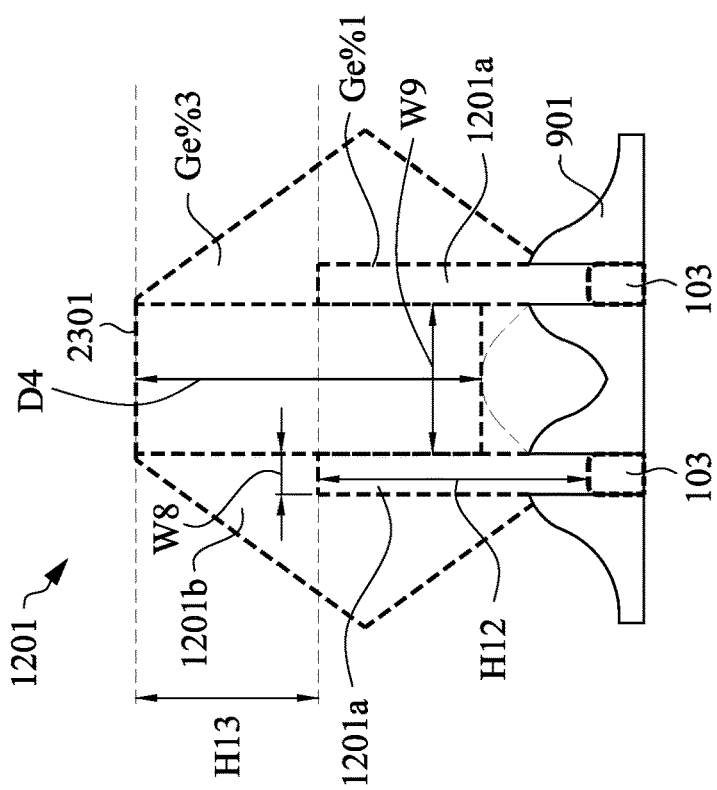

FIG. 23 is a magnified view (not to scale) of the multilayer source/drain regions 1201 of the adjacent source/drain regions, in accordance with still another embodiment. The multilayer source/drain regions 1201 illustrated in FIG. 23 comprise the second epitaxial growth layers 1201b formed to a thirteenth height H13 having the third concentration ratio (Ge %3) and are formed to fill the top volume of the multilayer source/drain regions 1201 over the first epitaxial growth layers 1201a formed to a twelfth height H12 having the first concentration ratio (Ge %1). According to some embodiments, the first epitaxial growth layers 1201a are formed over the fins 103 to the twelfth height H12 of between about 20 nm and about 50 nm. However, any suitable height may be used. In some embodiments, the second epitaxial growth layers 1201b are formed over the first epitaxial growth layers 1201a to the thirteenth height H13 of between about 10 nm and about 30 nm. The embodiment illustrated in FIG. 23 is similar to the embodiment illustrated in FIG. 22; however, the first epitaxial growth layers 1201a are formed with rectangular shapes instead of rounded shapes.

According to some embodiments, the first epitaxial growth layers 1201a may be formed by using appropriate masking and etching techniques and/or tuning the flow rate of the etching precursor during deposition to perform a substantially vertical etch of the first epitaxial growth layers 1201a. In some embodiments, the first epitaxial growth layers 1201a are formed by initially depositing a dielectric masking layer (e.g., an insulation material layer, an interlayer dielectric, a hard mask, or the like) over the fins 103 and planarized with the tops of the fins 103 using a suitable planarization process (e.g., CMP), Once formed, the fins 103 are recessed to form the first openings 1001, as described above. As such, the first openings 1001 are formed with an eighth width W8 between sidewalls of the dielectric masking layer (not shown), the gate spacers 901, and/or the STI regions 105. In such embodiments, the first epitaxial growth layers 1201a may then be grown to fill and/or overfill the openings 1001 as described above except the growth of the first epitaxial growth layers 1201a is constrained within the first openings 1001 by the sidewalls of the dielectric masking layer. Once formed, excess material of the first epitaxial growth layers 1201a is removed and tops of the first epitaxial growth layers 1201a are planarized with the dielectric masking layer to the twelfth height H12. Once planarized, the dielectric masking layer may be removed using a suitable etching materials and techniques that are selective to the material of the masking layer and non-selective to the material of the first epitaxial growth layers 1201a. As such, the first epitaxial growth layers 1201a are formed with a square or rectangular shape having the eighth width W8 and to the twelfth height H12 above the fins 103 and the sidewalls of the first epitaxial growth layers 1201a above the spacers 901 are exposed for further processing.

According to some embodiments, the first epitaxial growth layers 1201a are formed to the eighth width W8 of between about 1 nm and about 15 nm. However, any suitable width may be used. In some embodiments, the eighth width W8 is about the same as a width of the fins 103. Furthermore, the first epitaxial growth layers 1201a are formed using a twelfth timed deposition process for a time period of between about 10 seconds and about 100 seconds, in accordance with some embodiments. As such, the first epitaxial growth layers 1201a are formed over the fins 103 to the twelfth height H12. However, any suitable time period and any suitable height may be used. Furthermore, the second epitaxial growth layers 1201b are formed using a thirteenth timed deposition process for a time period of between about 50 seconds and about 200 seconds, in accordance with some embodiments. Accordingly, the second epitaxial growth layers 1201b are formed over the first epitaxial growth layers 1201a to the thirteenth height H13. However, any suitable time period and any suitable height may be used. As such, the multilayer source/drain region 1201 of the illustrated embodiment comprises a fourth multilayer concentration ratio (H13/H12) which is between about 0.1:1 and about 1.5:1. Furthermore, the multilayer source/drain regions 1201 in the illustrated embodiment comprises a sixth shared contact landing region 2301 that is formed with a relatively large volume of material having the highest concentration ratios (e.g., Ge %3) according to still another embodiment. The sixth shared contact landing region 2301 comprises a very deep and very wide extension area of the high concentration germanium (Ge %3) material that is formed between the first epitaxial growth layers 1201a. The boundaries of the sixth shared contact landing region 2301 are highlighted by a dashed line in FIG. 23. The sixth shared contact landing region 2301 contains the volume of the high concentration of germanium (Ge %3) under the flat tops of the merged second layers 1201b down to and including the volume between the sidewalls of the first epitaxial growth layers 1201a. The sixth shared contact landing region 2301 extends to the fourth depth D4 along the centerline between the first epitaxial growth layers 1201a from the tops of the second epitaxial growth layers 1201b to the bottom of the second epitaxial growth layers 1201b. Due to the rectangular shapes of the first epitaxial growth layers 1201a, the very deep extension area is also very wide. According to some embodiments, a minimum width of the high concentration of germanium (Ge %3) between the first epitaxial growth layers 1201a may be a ninth width W9 of between about 10 nm and about 50 nm. However, any suitable width may be used. As such, the embodiment of the sixth shared contact landing region 2301 provides a high volume landing region with a very deep and very wide extension region that also has a low contact resistance for the eventual formation of the source/drain contact 1803.

Figure 24:
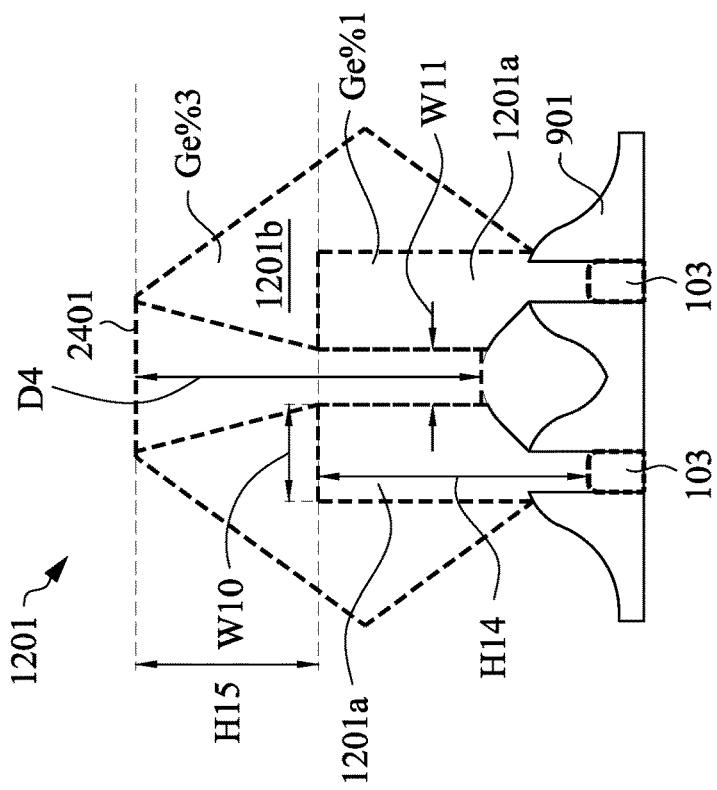

FIG. 24 is a magnified view (not to scale) of the multilayer source/drain regions 1201 of the adjacent source/drain regions, in accordance with yet another embodiment. The multilayer source/drain regions 1201 illustrated in FIG. 24 comprise the second epitaxial growth layers 1201b formed to a fifteenth height H15 having the third concentration ratio (Ge %3) and are formed over the first epitaxial growth layers 1201a formed to a fourteenth height H14 having the first concentration ratio (Ge %1). According to some embodiments, the first epitaxial growth layers 1201a are formed over the fins 103 to the fourteenth height H14 of between about 20 nm and about 50 nm. However, any suitable height may be used. In some embodiments, the second epitaxial growth layers 1201b are formed over the first epitaxial growth layers 1201a to the fifteenth height H15 of between about 10 nm and about 30 nm. The embodiment illustrated in FIG. 24 is similar to the embodiment illustrated in FIG. 23; however, the first epitaxial growth layers 1201a are formed with very wide rectangular shapes as compared to those formed in the embodiment of FIG. 23. According to some embodiments, the rectangular shapes of the first epitaxial growth layers 1201a may be formed using similar masking and etching techniques and/or tuning of the etching precursor during formation that are used to form the square shapes, as discussed above with regard to FIG. 23. In some embodiments, the first epitaxial growth layers 1201a may be formed to a tenth width Wm of between about 10 nm and about 30 nm. However, any suitable width may be used. Furthermore, the first epitaxial growth layers 1201a may be shaped with an undercut feature between the second epitaxial layer 1201b and the gate spacers 901. The undercut feature may be formed by tuning (e.g., between about 10% to about 30%) the precursor of the low concentration material used to grow the first epitaxial growth layers 1201a (e.g., Ge %1). According to some embodiments, the tenth width Wm is much wider than the widths of the fins 103. According to some embodiments, the first epitaxial growth layers 1201a are formed using a fourteenth timed deposition process for a time period of between about 10 seconds and about 200 seconds. As such, the first epitaxial growth layers 1201a are formed over the fins 103 to the fourteenth height H14. However, any suitable time period and any suitable height may be used. Furthermore, the second epitaxial growth layers 1201b are formed using a fifteenth timed deposition process for a time period of between about 50 seconds and about 100 seconds, in accordance with some embodiments. Accordingly, the second epitaxial growth layers 1201b are formed over the first epitaxial growth layers 1201a to the fifteenth height H15. However, any suitable time period and any suitable height may be used. As such, the multilayer source/drain region 1201 of the illustrated embodiment comprises a fifth multilayer concentration ratio (H15/H14) which is between about 0.1:1 and about 1.5:1. Furthermore, the multilayer source/drain regions 1201 in the illustrated embodiment comprises a seventh shared contact landing region 2401 that is formed with a relatively large volume of material having the highest concentration ratios (e.g., Ge %3) according to yet another embodiment.

The seventh shared contact landing region 2401 comprises a very wide upper portion of the high concentration germanium (Ge %3) material under the flat tops of the merged second layers 1201b and a very deep and narrow extension area of the high concentration germanium (Ge %3) material that is formed between the first epitaxial growth layers 1201a. The boundaries of the seventh shared contact landing region 2401 are highlighted by a dashed line in FIG. 24. The seventh shared contact landing region 2401 contains the volume of the high concentration of germanium (Ge %3) under the flat tops of the merged second layers 1201b angled down to and including the volume between the sidewalls of the first epitaxial growth layers 1201a. The seventh shared contact landing region 2401 extends to the fourth depth D4 along the centerline between the first epitaxial growth layers 1201a from the top of the second epitaxial growth layers 1201b to the bottom of the second epitaxial growth layers 1201b. Due to the wide rectangular shapes of the first epitaxial growth layers 1201a, the very deep extension area is also narrow as compared to the embodiment of FIG. 23. According to some embodiments, a minimum width of the high concentration of germanium (Ge %3) between the first epitaxial growth layers 1201a may be a eleventh width Wil of between about 5 nm and about 20 nm. However, any suitable width may be used. As such, the embodiment of the seventh shared contact landing region 2401 provides a high volume landing region with a very deep but narrow extension region and also has a low contact resistance for the eventual formation of the source/drain contact 1803.

According to the embodiments disclosed, the structures and material compositions allow for a low contact resistance (Rcsd) design of the multilayer source/drain regions 1201 for a PMOS device (e.g., EDX at P-FET I/O region). In particular, a shared contact landing region 1203 (e.g., a high volume MD landing area) having a relatively high concentration percentage of germanium (Ge %3), which has a lower bandgap than silicon, allow for a design of the multilayer source/drain regions 1201 having a low Schottky barrier height (SBH) and a low contact resistance (Rcsd). The Rp resistivity is a measure of the resistivity between the p-type doped epitaxial material of the third epitaxial growth layers 1201C and the metal materials of the source/drain contact 1803. According to some embodiments, the multilayer source/drain region 1201 has a reduced Rp resistivity (e.g., −0.2 k). Furthermore, the Rch resistivity represents the resistivity of the channel region 805 (illustrated in FIG. 18B) of the fins 103 which separates the multilayer source/drain regions 1201 from one another. According to some embodiments, the multilayer source/drain region 1201 has a reduced Rch resistivity (e.g., −0.2 k). According to embodiments disclosed herein, the decrease in Rp resistivity and/or the decrease in Rch resistivity provides the added benefit of a +4% DC gain and/or +2% RO performance gain for the second FinFET 1800. In embodiments in which an intermediate epitaxial growth layer (e.g., the second epitaxial growth layer 1201b) is formed, the intermediate epitaxial growth layer prevents the third epitaxial growth layers 1201C strain relaxation due to a high lattice mismatch between the epitaxial growth layers separated by the intermediate epitaxial growth layer (e.g., the first epitaxial growth layers 1201a and the third epitaxial growth layers 1201c). Furthermore, the third epitaxial growth layers 1201C provide a low contact resistance between the multilayer source/drain regions 1201 and subsequently formed metal contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. Interlayer dielectrics (ILDs) and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

According to an embodiment, a method includes: forming a first fin in a substrate; forming a first source/drain region to a first height over the first fin, the first source/drain region including a first concentration of germanium; and forming a top layer to a second height over the first source/drain region, the top layer including a second concentration of germanium that is greater than the first concentration of germanium and the second height being greater than 1 nm. In an embodiment, the method further includes: forming a second fin in the substrate; forming a second source/drain region to the first height over the second fin, the second source/drain region including the first concentration of germanium; and wherein forming the top layer further includes forming the top layer to the second height over the second source/drain region. In an embodiment of the method, forming the top layer further includes filling a gap between the first source/drain region and the second source/drain region with the top layer. In an embodiment of the method, the second source/drain region is at least partially merged with the first source/drain region. In an embodiment of the method, the second source/drain region is not merged with the first source/drain region. In an embodiment of the method, the first concentration of germanium by volume is less than 50%. In an embodiment of the method, the second concentration of germanium by volume is 100%.

In another embodiment, a method includes: placing a wafer in a deposition chamber, the wafer comprising a fin; introducing a first precursor at a first flow rate to the deposition chamber; introducing a second precursor at a second flow rate to the deposition chamber, a first flow rate ratio being a ratio of the second flow rate to the first flow rate; using the first flow rate ratio for a first process time to form a source/drain region over the fin, the source/drain region comprising a first concentration level of germanium; tuning the first flow rate to a third flow rate and tuning the second flow rate to a fourth flow rate, a second flow rate ratio being a ratio of the fourth flow rate to the third flow rate, the second flow rate ratio being greater than the first flow rate ratio; and using the second flow rate ratio for a second process time to form a contact landing region to a first thickness of at least 1 nm over the source/drain region, the contact landing region comprising a second concentration level of germanium that is greater than the first concentration level of germanium. In an embodiment the first precursor comprises a high-order silane precursor and the second precursor comprises a germanium precursor. In an embodiment the first concentration level of germanium is less than 50% by volume germanium. In an embodiment the second concentration level of germanium is at less 50% by volume germanium. In an embodiment the third flow rate is less than the first flow rate. In an embodiment the fourth flow rate is higher than the second flow rate. In an embodiment introducing a third precursor to the deposition chamber, the third precursor comprising an n-type dopant. In an embodiment the n-type dopant is diborane.

According to yet another embodiment, a semiconductor device includes: a first fin within a substrate; a second fin within the substrate and adjacent to the first fin; a first source/drain region over the first fin, wherein the first source/drain region includes a low concentration of germanium; a second source/drain region over the second fin, wherein the second source/drain region includes the low concentration of germanium; a contact landing region over the first source/drain region and the second source/drain region, the contact landing region including a high concentration of germanium and having a first height of at least 1 nm over top surfaces of the first source/drain region and the second source/drain region; and a source/drain contact, wherein at least a portion of the source/drain contact is embedded in the contact landing region. In an embodiment of the device, the low concentration of germanium is less than 50% by volume germanium. In an embodiment of the device, the high concentration of germanium is greater than 50% by volume germanium. In an embodiment of the device, the contact landing region includes an extension region located between sidewalls of the first source/drain region and the second source/drain region. In an embodiment of the device, the first source/drain region is at least partially merged with the second source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin in a substrate;
   forming a first source/drain region to a first height over the first fin, the first source/drain region comprising a first concentration of germanium;
   forming a second source/drain region over the second fin, the second source/drain region comprising the first concentration of germanium; and
   forming a top layer to a second height over the first source/drain region and the second source/drain region, the top layer extending continuously from over the first fin to over the second fin, the top layer comprising a second concentration of germanium that is greater than the first concentration of germanium and the second height being greater than 1 nm.

2. The method of claim 1, wherein the top layer extends along a downward facing facet of the first source/drain region.

3. The method of claim 1, wherein the forming the top layer further comprises filling a gap between the first source/drain region and the second source/drain region with the top layer.

4. The method of claim 3, wherein the second source/drain region is at least partially merged with the first source/drain region.

5. The method of claim 3, wherein the second source/drain region is not merged with the first source/drain region.

6. The method of claim 1, wherein the first concentration of germanium is less than 50%.

7. The method of claim 6, wherein the second concentration of germanium is 100%.

8. A method comprising:
   placing a wafer in a deposition chamber, the wafer comprising a fin;
   introducing a first precursor at a first flow rate to the deposition chamber;
   introducing a second precursor at a second flow rate to the deposition chamber, a first flow rate ratio being a ratio of the second flow rate to the first flow rate;
   using the first flow rate ratio for a first process time to form a source/drain region over the fin, the source/drain region comprising a first concentration level of germanium;
   tuning the first flow rate to a third flow rate and tuning the second flow rate to a fourth flow rate, a second flow rate ratio being a ratio of the fourth flow rate to the third flow rate, the second flow rate ratio being greater than the first flow rate ratio; and
   using the second flow rate ratio for a second process time to form a contact landing region to a first thickness of at least 1 nm over the source/drain region, the contact landing region comprising a second concentration level of germanium that is greater than the first concentration level.

9. The method of claim 8, wherein the first precursor comprises a high-order silane precursor and the second precursor comprises a germanium precursor.

10. The method of claim 9, wherein the first concentration level of germanium is less than 50% by volume germanium.

11. The method of claim 10, wherein the second concentration level of germanium is at less 50% by volume germanium.

12. The method of claim 10, wherein the third flow rate is less than the first flow rate.

13. The method of claim 10, wherein the fourth flow rate is higher than the second flow rate.

14. The method of claim 8 further comprises introducing a third precursor to the deposition chamber, the third precursor comprising an n-type dopant.

15. The method of claim 14, wherein the n-type dopant is diborane.

16. A semiconductor device comprises:
- a first fin within a substrate;
- a second fin within the substrate and adjacent to the first fin;
- a first source/drain region over the first fin, wherein the first source/drain region comprises a low concentration of germanium;
- a second source/drain region over the second fin, wherein the second source/drain region comprises the low concentration of germanium;
- a contact landing region over the first source/drain region and the second source/drain region, the contact landing region comprising a high concentration of germanium greater than the low concentration of germanium of the first source/drain region and the second source/drain region, the contact landing region having a first height of at least 1 nm over top surfaces of the first source/drain region and the second source/drain region, wherein the contact landing region separates the first source/drain region and the second source/drain region; and
- a source/drain contact, wherein at least a portion of the source/drain contact is in contact with the contact landing region.

17. The semiconductor device of claim 16, wherein the low concentration of germanium is less than 50% by volume germanium.

18. The semiconductor device of claim 17, wherein the high concentration of germanium is greater than 50% by volume germanium.

19. The semiconductor device of claim 16, wherein the contact landing region comprises an extension region located between sidewalls of the first source/drain region and the second source/drain region.

20. The semiconductor device of claim 16, wherein the first source/drain region is at least partially merged with the second source/drain region.

\* \* \* \* \*